United States Patent
Park

(10) Patent No.: US 7,142,021 B2
(45) Date of Patent: Nov. 28, 2006

(54) DATA INVERSION CIRCUITS HAVING A BYPASS MODE OF OPERATION AND METHODS OF OPERATING THE SAME

(75) Inventor: Min-sang Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 10/991,076

(22) Filed: Nov. 17, 2004

(65) Prior Publication Data
US 2005/0127945 A1   Jun. 16, 2005

(30) Foreign Application Priority Data
Dec. 13, 2003  (KR)  ............... 10-2003-0090940

(51) Int. Cl.
*H03K 19/20*  (2006.01)
(52) U.S. Cl. ............... 326/104; 326/56; 365/206; 365/233
(58) Field of Classification Search ............... 326/46, 326/52, 56, 104, 113; 365/194, 233, 189.05, 365/206
See application file for complete search history.

(56) References Cited

U.S. PATENT DOCUMENTS

| | | | |
|---|---|---|---|
| 4,462,102 A | 7/1984 | Povlick | 714/801 |
| 5,477,551 A | 12/1995 | Parks et al. | 714/758 |
| 5,881,076 A * | 3/1999 | Murray | 714/800 |
| 5,915,082 A * | 6/1999 | Marshall et al. | 714/11 |
| 5,931,927 A | 8/1999 | Takashima | 710/65 |
| 6,456,551 B1 | 9/2002 | Sohn et al. | 365/219 |
| 6,633,951 B1 | 10/2003 | Cohen | 711/105 |
| 6,731,567 B1 | 5/2004 | Acharya et al. | 365/233 |
| 6,735,733 B1 * | 5/2004 | La Rosa | 714/765 |
| 6,788,106 B1 | 9/2004 | Kwak et al. | 326/52 |
| 6,992,506 B1 * | 1/2006 | Park et al. | 326/52 |
| 2004/0066213 A1 | 4/2004 | Kwak et al. | 326/52 |

FOREIGN PATENT DOCUMENTS

| | | |
|---|---|---|
| EP | 1 336 972 | 8/2003 |
| KR | 000046659 | 7/2000 |
| KR | 000050971 | 8/2000 |

* cited by examiner

*Primary Examiner*—Daniel Chang
(74) *Attorney, Agent, or Firm*—Myers Bigel Sibley & Sajovec, PA

(57) ABSTRACT

An integrated circuit device includes a data inversion circuit configured to support an inversion mode of operation. The inversion mode of operation inverts selected ones of a plurality of N-bit words received in consecutive sequence at inputs thereof. The data inversion circuit is further configured to support a bypass mode of operation. The bypass mode of operation disables inversion of a second one of the plurality of N-bit words when a delay between receipt of the second one of the plurality of N-bit words and receipt of an immediately preceding first one of the plurality of N-bit words is greater than a predetermined time interval. Related methods are also discussed.

27 Claims, 19 Drawing Sheets

US 7,142,021 B2

DATA INVERSION CIRCUITS HAVING A BYPASS MODE OF OPERATION AND METHODS OF OPERATING THE SAME

REFERENCE TO PRIORITY APPLICATION

This application claims priority to Korean Patent Application No. 2003-90940, filed on Dec. 13, 2003, the disclosure of which is hereby incorporated by reference herein in its entirety.

CROSS-REFERENCE TO RELATED APPLICATIONS

This application is related to commonly assigned U.S. patent application Ser. No. 10/815,505, filed Apr. 1, 2004, the disclosure of which is hereby incorporated herein by reference. This application is also related to commonly assigned U.S. Pat. No. 6,788,106, filed Mar. 26, 2003, the disclosure of which is hereby incorporated by reference herein.

BACKGROUND OF THE INVENTION

1. Field of the Invention

The present invention relates to integrated circuit devices, and more particularly, to integrated circuit devices having high data bandwidth..

2. Description of the Related Art

Generally, semiconductor memory devices have a high bandwidth input/output (I/O) structure, and may include 32 data output pins, or DQ pins. In such a high bandwidth memory device, the 32 DQ pins may operate at the same time when data is output, resulting in a great amount of noise, known as simultaneous switching noise (SSN). Due to SSN, waveforms of data output signals may be distorted, which may deteriorate signal integrity of the memory device. As such, it may be difficult for the memory device to satisfy the input/output performance required in a high-frequency system. For this reason, conventional techniques to reduce SSN have included the use of data inversion circuits.

Data inversion methods may aim to reduce the amount of SSN generated in memory devices by limiting the number of parallel data signals that switch value during consecutive data output cycles. A memory device using the data inversion method may either invert and output current data or output the current data without inversion based on how many bits of data (generally, 8 bits) to be currently output are switched or "toggled" as compared to corresponding bits of previously output data. More particularly, if the number of toggled bits is greater than or equal to one-half of the number of bits to be currently output, the memory device may invert and output the data, and additionally may output a flag signal of 1-bit indicating that the data was inverted. On the other hand, if the number of toggled bits is less than one-half of the number of bits to be currently output, the memory device may output the data without inversion, and may additionally output a flag signal of 1-bit indicating that the data was not inverted. As such, the number of bits of the output data to be toggled can be reduced to less than half of the total number of bits to be output, and accordingly, switching noise in the memory device can be reduced. As a result, the signal intensity of output signals may be improved, such that input/output performance of the memory device may also be improved.

FIG. 1 illustrates a conventional data inversion circuit. FIG. 1 shows a data inversion circuit that performs inversion/non-inversion on 8-bit data to be output to 8 data output pads (DQ pads).

Referring to FIG. 1, the data inversion circuit 10 includes logic circuits 11 and 12 and a comparator 13. Each of the logic circuits 11 and 12 includes 8 XOR gates. The logic circuit 11 determines whether or not bits of data FDO1 through FDO8 to be currently output (which are read from a memory cell), are to be toggled based on corresponding bits of data DO1 through DO8 which were previously output from the data inversion circuit 10. The comparator 13 outputs a flag signal FLG with a predetermined level according to the determined result of the logic circuit 11. The logic circuit 12 inverts and outputs the data FDO1 through FDO8 to be currently output, or alternatively, outputs the data FDO1 through FDO8 without inversion, in response to the flag signal FLG.

As described above, a conventional data inversion circuit may determine whether or not each bit of the previous data (which may have been output in an inverted state or in a non-inverted state) is toggled compared to a corresponding bit of data to be currently output, in order to decide whether the data to be currently output should be inverted or should not be inverted. The previously output data and the data to be currently output may be continuous or non-continuous. In other words, an interval in which no data is read (i.e., an interval where no read instructions are received) may exist between a time when the previous data has been read and a time when the data to be currently output is read. For example, a time interval (i.e., a reading interval) between receipt of a first read command for reading first data and receipt of a second read command for reading second data may exceed a predetermined time interval. In such a case, the data output circuit of the memory device may achieve a stable state during this time interval. Once the data output circuit reaches a stable state, SSN may not be generated in the data output voltage.

However, a conventional data inversion circuit may be inefficient in that an inversion operation may be performed on the data to be currently output regardless of the presence of a reading interval between the previous data and the data to be currently output. In other words, the current output may be inverted to inhibit SSN even though SSN may not be present because of an extended reading interval where no switching is performed. Also, such an inversion operation may reduce the operating speed of the semiconductor device.

Also, a conventional data inversion circuit may compare data to be currently output with previously output data in order to decide whether or not the data to be currently output should be inverted. The previously output data may have been subjected to inversion/non-inversion, while the data to be currently output is data before being subjected to inversion/non-inversion. Accordingly, a timing margin may exist between the previous data and the data to be currently output. Such a timing margin may further reduce the operating speed of the data inversion circuit, and may limit the operational frequency of the semiconductor device.

SUMMARY OF THE INVENTION

According to some embodiments of the present invention, an integrated circuit device may include a data inversion circuit configured to support an inversion mode of operation. The inversion mode of operation inverts selected ones of a plurality of N-bit words received in consecutive sequence at inputs thereof. The data inversion circuit is further configured to support a bypass mode of operation. The bypass mode of operation disables inversion of a second one of the plurality of N-bit words when a delay between receipt of the second one of the plurality of N-bit words and receipt of an immediately preceding first one of the plurality of N-bit words is greater than a predetermined time interval.

In other embodiments, the data inversion circuit may include an inversion unit configured to support the inversion mode of operation and a bypass unit configured to support the bypass mode of operation. The bypass mode of operation may be selectively enabled in response to a control signal indicating that the delay is greater than the time interval. In further embodiments, the control signal may indicate that a delay window between receiving a first read instruction for the first word and a second read instruction for the second word in a consecutive sequence is greater than a predetermined number of clock cycles.

n some embodiments, the bypass unit may be selectively enabled when the control signal has a first logic value, and wherein the bypass unit is disabled when the control signal has a second logic value opposite the first logic value. In further embodiments, the inversion unit may be disabled when the control signal has the first logic value, and wherein the inversion unit is enabled when the control signal has the second logic value.

In other embodiments, the data inversion circuit may further include a controller that evaluates the delay and generates the control signal when the delay is greater than a predetermined number of clock cycles. In some embodiments, the delay may be a read interval between receiving a first read instruction for the first word and a second read instruction for the second word, and the controller may further include a control signal generator that generates the control signal at a logic 1 value when the read interval is greater than the predetermined number of clock cycles.

In further embodiments, the control signal generator may include a latch unit configured to generate the control signal at a logic 1 value responsive to a clock signal indicating passage of a predetermined number of clock cycles from receipt of the first read instruction. The control signal generator may further include a reset unit configured to reset the control signal to a logic 0 value responsive to receipt of the second read instruction.

In some embodiments, the plurality of N-bit words may include groups of N-bit words received in consecutive sequence in response to corresponding consecutive read instructions. The bypass mode of operation may disable inversion of a first one of a second group of N-bit words when a delay between receipt of the first one of the second group of N-bit words and receipt of a last one of an immediately preceding first group of N-bit words is greater than a predetermined number of clock cycles. In further embodiments, the device may be a dual data rate (DDR) memory device, and may include a memory cell array that is configured to support a 4-bit prefetch operation in response to the consecutive read instructions, wherein each group comprises four N-bit words.

According to other embodiments of the present invention, an integrated circuit device may include a data inversion circuit in a read path of the integrated circuit device. The data inversion circuit may include an inversion unit configured to inhibit simultaneous switching noise by inverting selected ones of a plurality of N-bit words received in consecutive sequence at inputs thereof. The data inversion circuit may further include a bypass unit configured to remove the inversion unit from the read path of the integrated circuit device in response to a control signal that indicates a delay between receipt of the second one of the plurality of N-bit words and receipt of an immediately preceding first one of the plurality of N-bit words is greater than a predetermined time interval.

In some embodiments, the data inversion circuit may further include a controller that evaluates the delay and generates the control signal when the delay is greater than a predetermined number of clock cycles. In further embodiments, the delay may be a read interval between receiving a first read instruction for the first word and a second read instruction for the second word, and wherein the controller further comprises a control signal generator that generates the control signal at a logic 1 value when the read interval is greater than the predetermined number of clock cycles.

In other embodiments, the control signal generator may include a latch unit configured to generate the control signal at a logic 1 value responsive to a clock signal indicating passage of a predetermined number of clock cycles from receipt of the first read instruction, and a reset unit configured to reset the control signal to a logic 0 value responsive to receipt of the second read instruction.

In some embodiments, the plurality of N-bit words may include groups of N-bit words received in consecutive sequence in response to corresponding consecutive read instructions. The bypass mode of operation may disable inversion of a first one of a second group of N-bit words when a delay between receipt of the first one of the second group of N-bit words and receipt of a last one of an immediately preceding first group of N-bit words is greater than a predetermined number of clock cycles.

According to further embodiments of the present invention, a method of operating a memory device read path having a data inversion circuit therein that is configured to reduce simultaneous switching noise when enabled may include reading data through an inversion unit of the data inversion circuit in order to reduce simultaneous switching noise at outputs of the memory device during first read operations. The method may further include bypassing the inversion unit to thereby reduce a read latency of the read path during second read operations that are less susceptible to simultaneous switching noise relative to the first read operations.

DETAILED DESCRIPTION OF THE INVENTION

Figure 1:
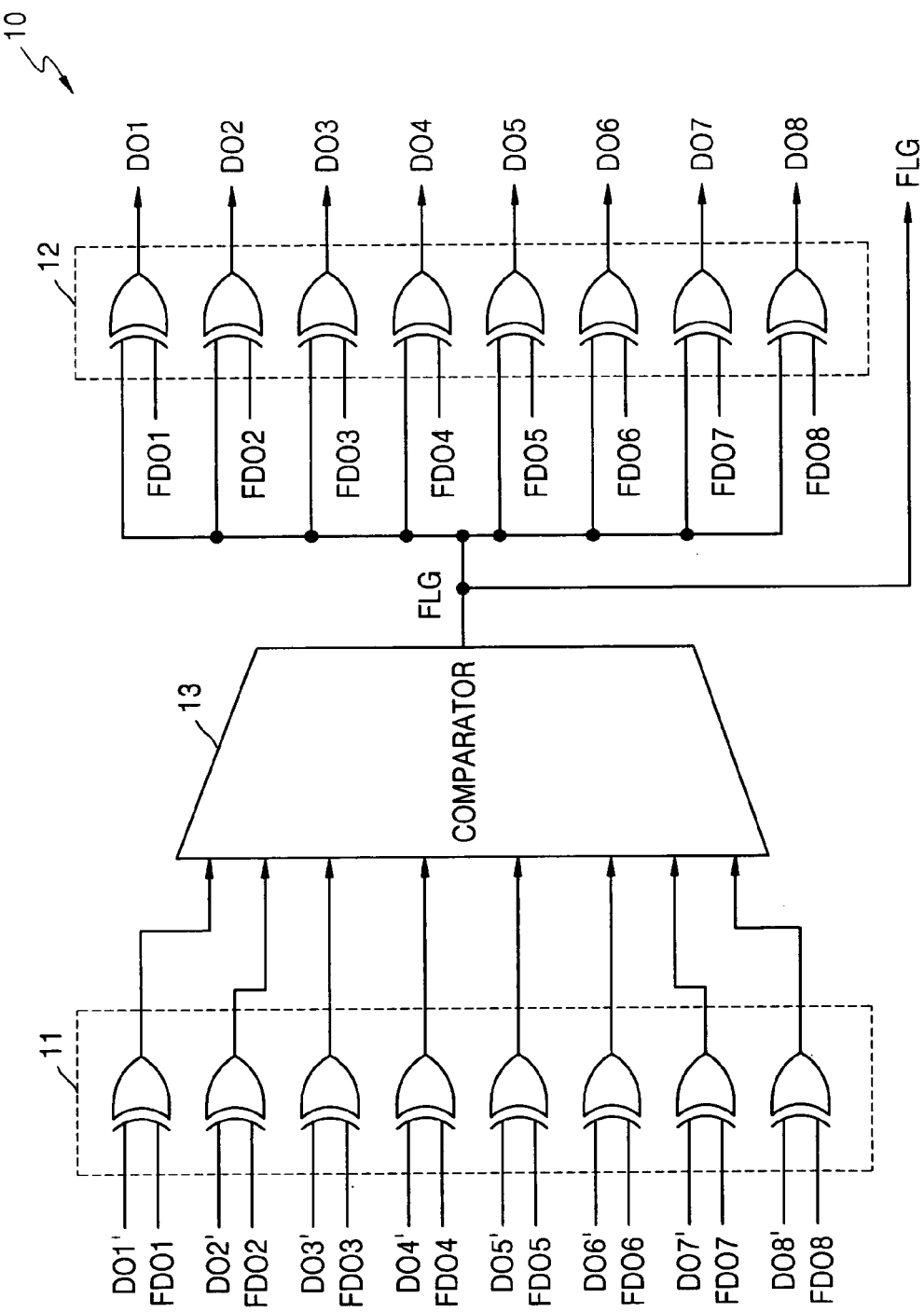
FIG. 1 illustrates a conventional data inversion circuit.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

Figure 2:
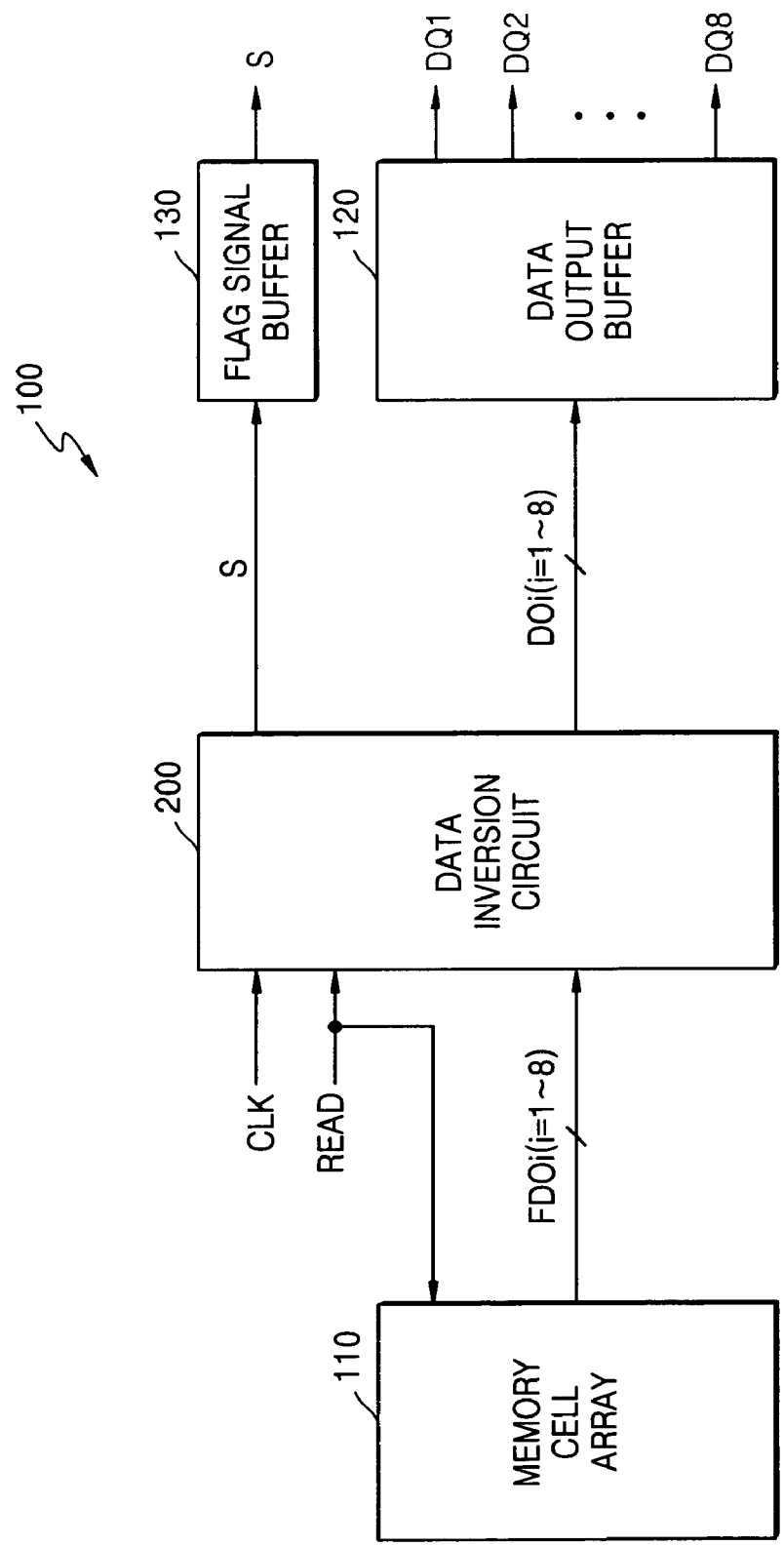
FIG. 2 is a block diagram illustrating an exemplary semiconductor memory device including a data inversion circuit according to some embodiments of the present invention.

FIG. 2 is a block diagram of a semiconductor memory device including a data inversion circuit according to some embodiments of the present invention. FIG. 2 illustrates a semiconductor device 100 including 8 DQ pads DQ1 through DQ8. Referring now to FIG. 2, the semiconductor memory device 100 includes a memory cell array 110, a data inversion circuit 200, a data output buffer 120 and a flag signal buffer 130. The memory cell array 110 outputs input data FDOi (i=1–8) to the data inversion circuit 200 in response to a read instruction READ. In FIG. 2, the designator "i" is used to identify data to be output to similarly designated DQ pads. Since the semiconductor memory device 100 of FIG. 2 has 8 DQ pads, "i" may be an integer from 1 to 8. For example, FDO1 represents data to be output to a DQ pad DQ1, and FDO2 represents data to be output to a DQ pad DQ2.

The data inversion circuit 200 receives a clock signal CLK and the read command READ, and receives the input data FDOi from the memory cell array 110. Although not shown in FIG. 2, the read command READ includes read commands READ(k−1) and READ(k) (where k can be a natural number equal to or greater than two) which are sequentially generated per a predetermined time interval. The data inversion circuit 200 determines whether or not a time interval or delay between receipt of a read command READ(k−1) and receipt of the following read command READ(k) exceeds a predetermined time interval, such as a predetermined number of clock cycles. The data inversion circuit 200 either performs inversion/non-inversion of the input data FDOi or bypasses the inversion operation according to the determined result, and outputs output data DOi (i=1–8). In other words, the data inversion circuit 200 may support a bypass operation that can disable an inversion operation of the data inversion circuit when a delay between receipt of initial input data FDOi(k−1) and receipt of input data FDOi(k) is greater than a predetermined time interval. The data inversion circuit 200 also outputs a flag signal S, indicating whether or not the input data FDOi is inverted.

The data output buffer 120 receives the output data DOi from the data inversion circuit 200 and outputs the output data DOi from the semiconductor memory device 100 through the first through eighth DQ pads DQ1 through DQ8.

Meanwhile, the flag signal S output from the data inversion circuit 200 is output to an external source through the flag signal buffer 130. The flag signal S may preferably be output to the external source through a data masking pin (DM pin). The DM pin may be a separate pin from the data output pins/pads and may generally be included in SDRAM. The DM pin may be used to mask input data in a write mode, i.e. used to prevent input data from being written in a semiconductor memory device. The DM pin is generally not used in a read mode. Accordingly, since an existing DM pin may be used to output the flag signal, additional pins to output the flag signal may be unnecessary in the semiconductor memory device.

Figure 3:
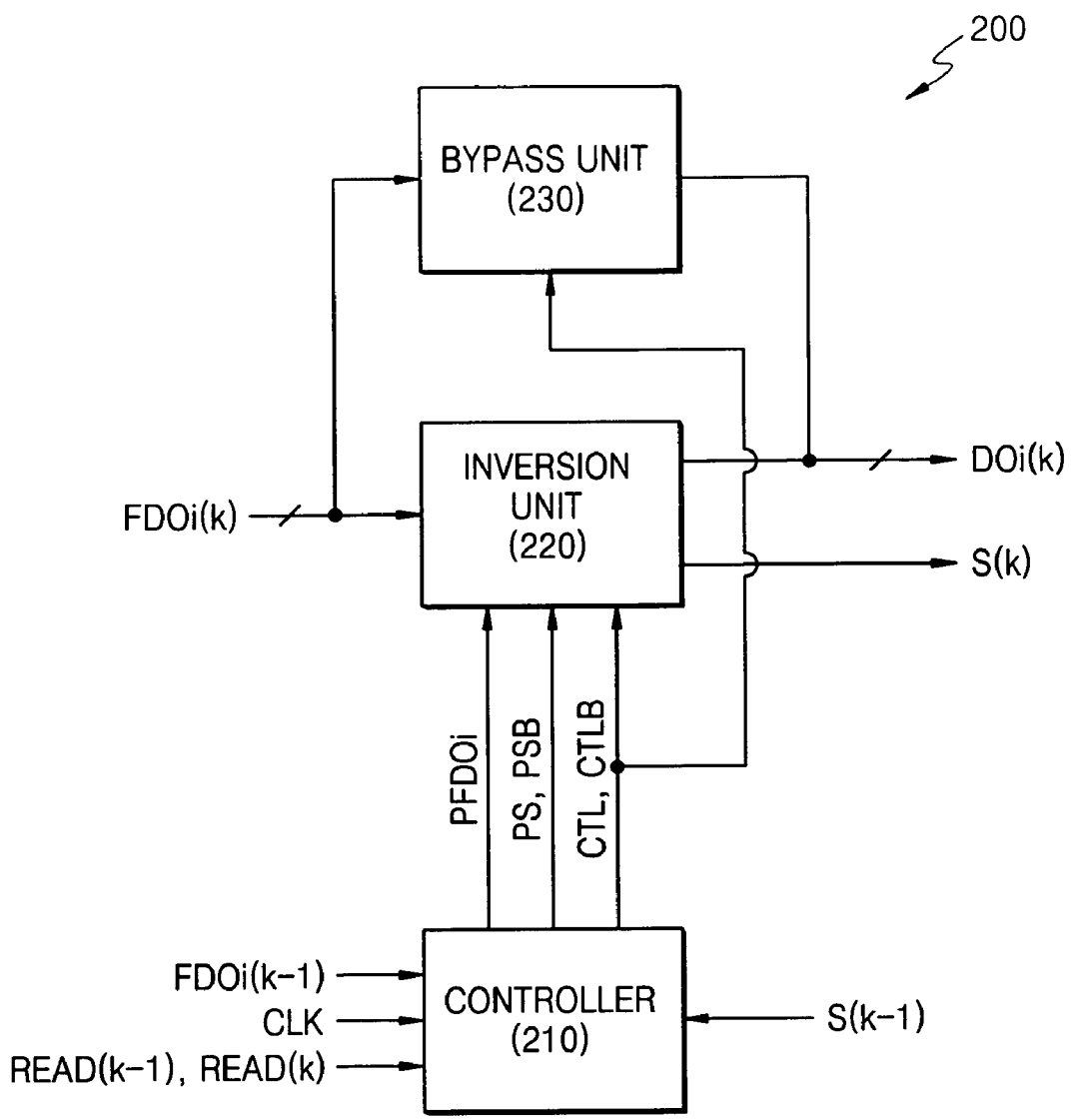
FIG. 3 is a block diagram illustrating a data inversion circuit according to some embodiments of the present invention as shown in FIG. 2.

FIG. 3 is a detailed block diagram of a data inversion circuit according to some embodiments of the present invention as shown in FIG. 2. In FIG. 3, input data FDOi(k−1) is read from the memory cell array 110 of FIG. 2 in response to a read command READ(k−1), and input data FDOi(k) is read from the memory cell array 110 in response to a read command READ(k). In the embodiments illustrated in FIG. 3, the read command READ(k−1) is received prior to the read command READ(k), i.e. the read command READ(k−1) is an initial read command.

Referring now to FIG. 3, the data inversion circuit 200 includes a controller 210, an inversion unit 220, and a bypass unit 230. When the controller 210 receives the read command READ(k−1), the controller 210 stores the input data FDOi(k−1) and a flag signal S(k−1) (where k can be a natural integer greater than or equal to two). The flag signal S(k−1) indicates whether or not the input data FDOi(k−1) is inverted. The controller 210 also receives a clock signal CLK and the read commands READ(k−1) and READ(k), and determines whether a read interval between read commands exceeds a predetermined number of clock cycles. The controller 210 outputs a control signal CTL and an inverted control signal CTLB according to the determined result. If the controller 210 receives the read command READ(k) when the read interval is equal to or smaller than the predetermined number of clock cycles, the controller 210 outputs initial input data PFDOi, an initial flag signal PS and an inverted initial flag signal PSB. The initial input data PFDOi and the initial flag signal PS are the input data FDOi(k−1) and the flag signal S(k−1) stored in the controller 210. The initial input data PFDOi is then compared (bit-to-bit) with the data FDOi(k) to be currently output, in order to determine whether or not to invert the data to be currently output. In other words, when the read interval is less than or equal to the predetermined period, the controller 210 enables the inversion unit 220. Also, the initial flag signal PS indicates whether or not the initial input data PFDOi is inverted.

Meanwhile, when the read interval exceeds the predetermined number of clock cycles, the controller 210 does not output the initial input data PFDOi, the initial flag signal PS and the inverted initial flag signal PSB to the inversion unit 220. The controller 210 is described in greater detail below with reference to FIGS. 4 through 7.

Still referring to FIG. 3, the inversion unit 220 is enabled or disabled in response to the control signal CTL and the inverted control signal CTLB. When the inversion unit 220 is enabled, the inversion unit 220 determines whether each of the bits of the input data FDOi(k) are toggled with respect to the corresponding bits of the initial input data PFDOi. Then, the inversion unit 220 inverts and outputs the input data FDOi(k) or outputs the input data FDOi(k) without inversion, in response to the determined result. Also, the inversion unit 220 outputs a flag signal S(k) indicating whether or not the input data FDOi(k) is inverted.

The bypass unit 230 is enabled or disabled in response to the control signal CTL and the inverted control signal CTLB. When the bypass unit 230 is enabled, the bypass unit 230 receives and outputs the input data FDOi(k) as the output data DOi(k). The controller 210 enables the bypass unit 230 when the read interval is greater than the predetermined period. In other words, when the bypass unit 230 is enabled, the inversion unit 220 is disabled. The inversion unit 220 and the bypass unit 230 are described below in further detail with reference to FIG. 8.

Figure 4:
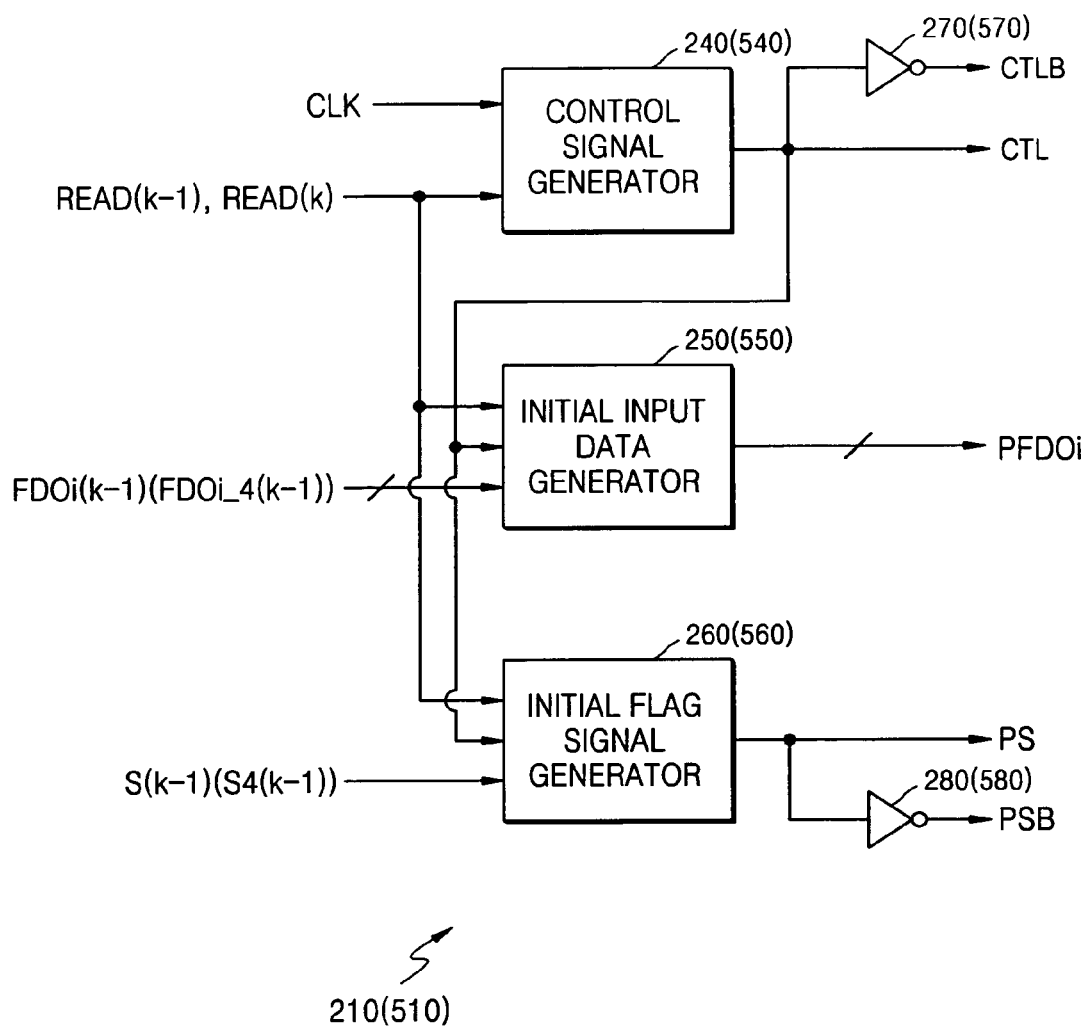
FIG. 4 is a block diagram illustrating a controller according to some embodiments of the present invention as shown in FIG. 3.

FIG. 4 is a detailed block diagram of a controller according to some embodiments of the present invention as shown in FIG. 3. Referring to FIG. 4, the controller 210 includes a control signal generator 240, an initial input data generator 250, an initial flag signal generator 260, and inverters 270 and 280. The control signal generator 240 receives the clock signal CLK and the read commands READ(k−1) and READ(k), and determines whether or not the read interval exceeds the predetermined number of clock cycles.

The control signal generator 240 outputs the control signal CTL with a high (logic 1) level when the read interval exceeds the predetermined number of clock cycles. Alternatively, the control signal generator 240 outputs the control signal CTL with a low (logic 0) level when the read interval is less than or equal to the predetermined number of clock cycles. For example, if the predetermined number of clock cycles is two, the control signal generator 240 outputs the control signal CTL with a high level if the read command READ(k) is not received within two clock cycles after the read command READ(k−1) is received. On the other hand, the control signal generator 240 outputs the control signal CTL with a low level if the read command READ(k) is received within two clock cycles after the read command READ(k−1) is received. The inverter 270 inverts the control signal CTL and outputs an inverted control signal CTLB.

The initial input data generator 250 stores the input data FDOi(k−1) in response to the read command READ(k−1) and the control signal CTL, and outputs the input data FDOi(k−1) as initial input data PFDOi in response to the read command READ(k).

The initial flag signal generator 260 stores the flag signal S(k−1) in response to the read command READ(k−1) and the control signal CTL, and outputs the flag signal S(k−1) as an initial flag signal PS in response to the read command READ(k). The inverter 280 inverts the initial flag signal PS and outputs an inverted initial flag signal PSB.

Figure 5:
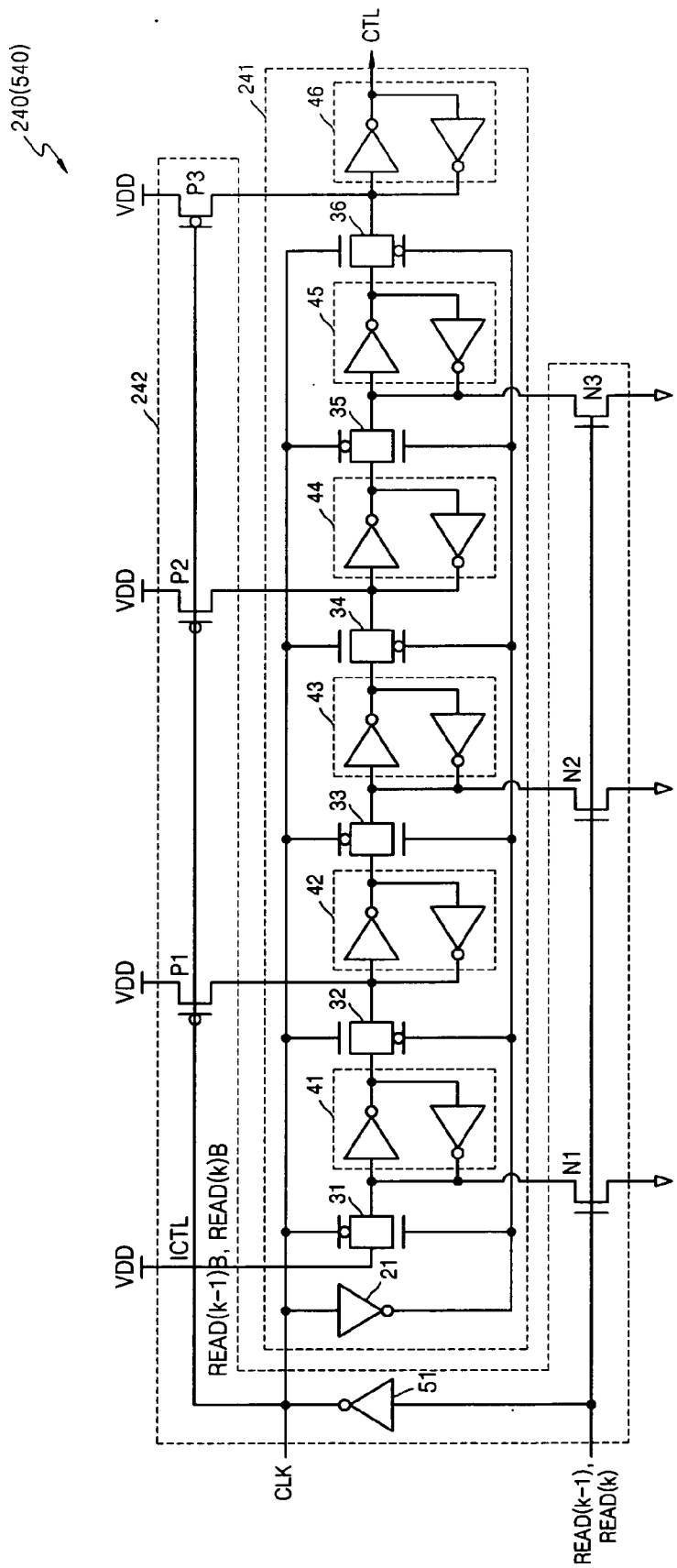
FIG. 5 is a schematic diagram illustrating a control signal generator according to some embodiments of the present invention as shown in FIG. 4.

FIG. 5 is a schematic diagram of a control signal generator according to some embodiments of the present invention as shown in FIG. 4. Referring to FIG. 5, the control signal generator 240 includes a latch unit 241 and a reset unit 242. The latch unit 241 latches and stores a first internal control signal ICTL in response to a clock signal CLK, delays the first internal control signal ICTL by a predetermined time, and outputs the delayed signal as the control signal CTL. The first internal control signal ICTL has an internal voltage level VDD.

The latch unit 241 includes an inverter 21, transmission gates 31 through 36, and latch circuits 41 through 46. The number of the transmission gates and latch circuits included in the latch unit 241 may be changed according to the predetermined time period. In FIG. 5, for example, the predetermined time period is 3 clock cycles.

Still referring to FIG. 5, the inverter 21 inverts the clock signal CLK and outputs an inverted clock signal CLKB. The transmission gates 31 through 36 are connected in series, and the latch circuits 41 through 46 are each connected to respective output terminals of the transmission gates 31 through 36. The transmission gates 31 through 36 are turned on or off in response to the clock signal CLK and the inverted clock signal CLKB. When the transmission gates 31, 33 and 35 are turned on, the transmission gates 32, 34 and 36 are turned off. In other words, the transmission gates 31, 33 and 35 and the transmission gates 32, 34 and 36 are alternately turned on in response to the clock signal CLK and the inverted clock signal CLKB. As a result, the first internal control signal ICTL is passed sequentially through the transmission gates 31 through 35 and latched sequentially by the latch circuits 41 through 45. Transmission gate 36 and latch circuit 46 output the first internal control signal ICTL as the control signal CTL.

The first internal control signal ICTL passes through two transmission gates in one clock cycle. Accordingly, the first internal control signal ICTL passes through the six transmission gates 31 through 36 in three clock cycles, i.e. in the predetermined period.

Again referring to FIG. 5, the reset unit 242 resets the latch unit 241 in response to the read commands READ(k−1) and READ(k). The reset unit 242 includes an inverter 51, NMOS transistors N1 through N3, and PMOS transistors P1 through P3. The inverter 51 inverts the read commands READ(k−1) and READ(k) received sequentially and sequentially outputs inverted read commands READ(k−1)B and READ(k)B.

The respective drains of the NMOS transistors N1 through N3 are connected to respective input terminals of the latch circuits 41, 43 and 45, respective sources of the NMOS transistors N1 through N3 are connected to a ground voltage, and the read commands READ(k−1) and READ(k) are applied sequentially to respective gates of NMOS transistors N1 through N3. The NMOS transistors N1 through N3 are turned on or off in response to the sequentially received read commands READ(k−1) and READ(k). When the NMOS transistors N1 through N3 are turned on, the NMOS transistors N1 through N3 pre-discharge the input terminals of the latch circuits 41, 43 and 45 to a ground voltage level.

The sources of the PMOS transistors P1 through P3 are connected to an internal voltage VDD, respective drains of the PMOS transistors P1 through P3 are connected to respective input terminals of the latch circuits 42, 44 and 46, and the inverted read commands READ(k−1)B and READ(k)B are applied sequentially to respective gates to PMOS transistors P1 through P3. The PMOS transistors P1 through P3 are turned on or off in response to the inverted read commands READ(k−1)B and READ(k)B. When the PMOS transistors P1 through P3 are turned on, the PMOS transistors P1 through P3 pre-charge the input terminals of the latch circuits 42, 44 and 46 to the internal voltage level VDD.

Operations of the control signal generator 240 will now be described in greater detail with reference to FIG. 5. When the clock signal CLK is at a high (logic 1) level, the read command READ(k−1) is enabled for a predetermined time and then disabled. If the read command READ(k−1) is enabled, the reset unit 242 resets the latch unit 241 in response to the read command READ(k−1). Thereafter, when the clock signal CLK is changed to a low (logic 0) level, the transmission gates 31, 33 and 35 of the latch unit 241 are turned-on and the transmission gates 32, 34 and 36 are turned-off. The transmission gate 31 receives and outputs the first internal control signal ICTL with a high level. The latch circuit 41 latches the first internal control signal ICTL with the high level received from the transmission gate 31 and outputs the first internal control signal ICTL with a low level. If the clock signal CLK is changed to a high level, the transmission gates 31, 33 and 35 are turned off, and the transmission gates 32, 34 and 36 are turned on. The transmission gate 32 receives and outputs the first internal control signal ICTL with a low level received from the latch circuit 41. The latch circuit 42 latches the first internal control signal ICTL with the low level received from the transmission gate 32 and outputs the first internal control signal ICTL with a high level. The transmission gates 33 through 36 and the latch circuits 43 through 46 operate similarly to the transmission gates 31 and 32 and the latch circuits 41 and 42.

If the following read command READ(k) is received within three clock cycles after the read command READ(k−1) is received, the latch unit 241 is reset to maintain the control signal CTL in a low level, thereby enabling the inversion unit 220. Alternatively, if the following read command READ(k) is received later than three clock cycles from receipt of the read command READ(k−1), the latch unit 241 outputs the control signal CTL with a high level, thereby enabling the bypass unit 230.

Figure 6:
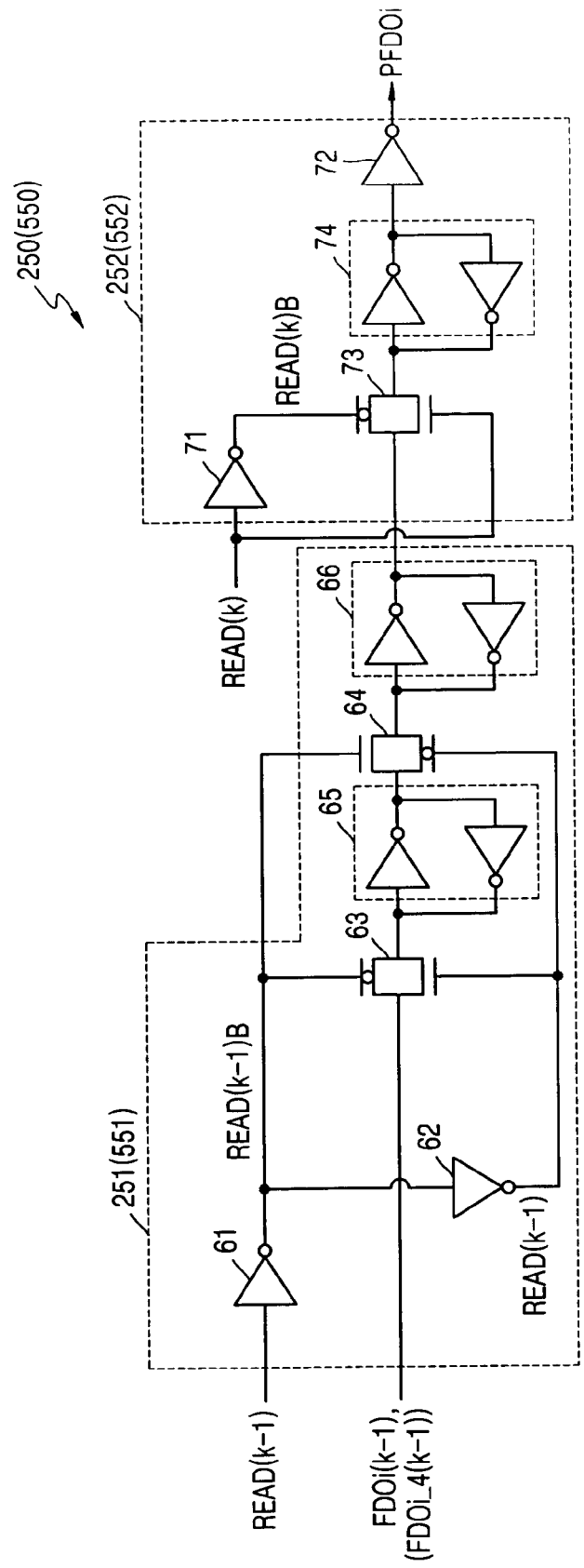
FIG. 6 is a schematic diagram illustrating an initial input data generator according to some embodiments of the present invention as shown in FIG. 4.

FIG. 6 is a schematic diagram of an initial input data generator according to some embodiments of the present invention as shown in FIG. 4. Although a single initial input data generator is shown in FIG. 6, additional initial input data generators corresponding to the number of bits of input data may be necessary. For example, if 8-bit input data FDO1 through FDO8 is used, eight input data generators may be necessary. With reference to FIG. 6, operation of a single initial input data generator will be described for convenience.

Referring now to FIG. 6, the initial input data generator 250 includes a data latch unit 251 and a data output unit 252. The data latch unit 251 is enabled or disabled in response to the read command READ(k−1). If the data latch unit 251 is enabled, the data latch unit 251 latches and stores input data FDOi(k−1). The data latch unit 251 includes inverters 61 and 62, transmission gates 63 and 64, and latch circuits 65 and 66.

The inverter 61 inverts the read command READ(k−1) and outputs an inverted read command READ(k−1)B. The inverter 62 again inverts the inverted read command READ(k−1)B and outputs the read command READ(k−1).

The transmission gates 63 and 64 are connected in series, and have output terminals connected to respective latch circuits 65 and 66. The transmission gates 63 and 64 are turned on or off in response to the read command READ(k−1) and the inverted read command READ(k−1)B. If the transmission gate 63 is turned on, the transmission gate 64 is turned off. As a result, the input data FDOi(k−1) passes sequentially through the transmission gates 63 and 64 and is latched sequentially by the latch circuits 65 and 66.

The data output unit 252 is enabled or disabled in response to the read command READ(k). If the data output unit 252 is enabled, the data output unit 252 receives the input data FDOi(k−1) from the latch circuit 67 and outputs the input data FDOi(k−1) as initial input data PFDOi.

The data output unit 252 includes inverters 71 and 72, a transmission gate 73, and a latch circuit 74. The inverter 71 inverts the read command READ(k) and outputs an inverted read command READ(k)B. The input terminal of the transmission gate 73 is connected to the output terminal of the latch circuit 66, and the output terminal of the transmission gate 73 is connected to the input terminal of the latch circuit 74. The output terminal of the latch circuit 74 is connected to the input terminal of the inverter 72. The transmission gate 73 is turned on or off in response to the read command READ(k) and the inverted read command READ(k)B. When the transmission gate 73 is turned on, the transmission gate 73 receives the input data FDOi(k−1) from the latch circuit 66 and outputs the input data FDOi(k−1). The latch circuit 74 latches and outputs the input data FDOi(k−1) output from the transmission gate 73. The inverter 72 outputs the input data FDOi(k−1) received from the latch circuit 74 as initial input data PFDOi.

Operations of the initial input data generator 250 will now be described in greater detail with reference to FIG. 6. If the read command READ(k−1) is enabled at a high (logic 1) level during a predetermined time period, the inverter 61 inverts the read command READ(k−1) and outputs an inverted read command READ(k−1)B at a low (logic 0) level. Also, the inverter 62 again inverts the inverted read command READ(k−1)B and outputs the read command READ(k−1) at a high level. The transmission gate 63 is turned on and the transmission gate 64 is turned off in response to the read command READ(k−1) at a high level and the inverted read command READ(k−1)B at a low level. The transmission gate 63 receives and outputs the input data FDOi(k−1), and the latch circuit 65 latches and outputs the input data FDOi(k−1).

When the read command READ(k−1) is disabled to a low (logic 0) level, the inverter 61 outputs an inverted read command READ(k−1)B at a high (logic 1) level and the inverter 62 outputs a read command READ(k−1) at a low level. The transmission gate 64 is turned off and the transmission gate 64 is turned on in response to the read command READ(k−1) at a low level and the inverted read command READ(k−1)B at a high level. The transmission gate 64 receives the input data FDOi(k−1) from the latch circuit 65, and the latch circuit 66 latches and outputs the input data FDOi(k−1) output from the transmission gate 64.

Thereafter, if the read command READ(k) is enabled to a high (logic 1) level, the inverter 71 outputs an inverted read command READ(k)B with a low (logic 0) level. The transmission gate 73 is turned on and receives the input data FDOi(k−1) from the latch circuit 66 and outputs the input data FDOi(k−1), in response to the read command READ(k) at a high level and the inverted read command READ(k)B at a low level. The latch circuit 74 latches and outputs the input data FDOi(k−1) output from the transmission gate 73. The inverter 72 receives the input data FDOi(k−1) from the latch circuit 74 and outputs the input data FDOi(k−1) as the initial input data PFDOi.

Figure 7:
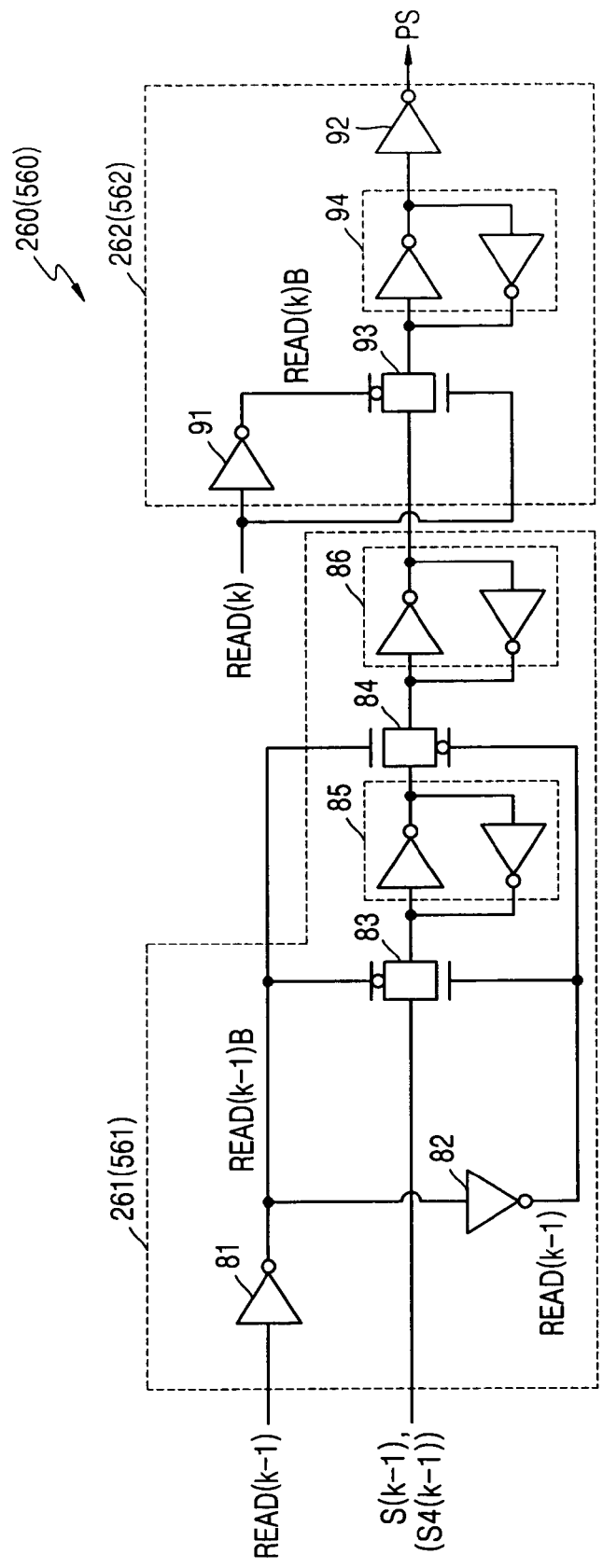
FIG. 7 is a schematic diagram illustrating an initial flag signal generator according to some embodiments of the present invention as shown in FIG. 4.

FIG. 7 is a schematic diagram of an initial flag signal generator according to some embodiments of the present invention as shown in FIG. 4. The initial flag signal generator 260 of FIG. 7 includes a flag latch unit 261 and a flag output unit 262. The flag latch unit 261 includes inverters 81 and 82, transmission gates 83 and 84, and latch circuits 85 and 86. The configuration and operation of the flag latch unit 261 are similar to that of the data latch unit 251 shown in FIG. 6, with the exception that the data latch unit 251 latches and stores the input data FDOi(k−1), while the flag latch unit 261 latches and stores the flag signal S(k−1). The flag output unit 262 includes inverters 91 and 92, a transmission gate 93 and a latch circuit 94. The configuration and operation of the flag output unit 262 are also similar to that of the data output unit 252 shown in FIG. 6, with the exception that the data output unit 252 receives and outputs the input data FDOi(k−1) as the initial input data PFDOi, while the flag output unit 262 receives and outputs the flag signal S(k−1) as the initial flag signal PS.

Operations of the initial flag signal generator 260 will now be described in greater detail with reference to FIG. 7. When the read command READ(k−1) is enabled to a high (logic 1) level during a predetermined time period, the inverter 81 inverts the read command READ(k−1) and outputs an inverted read command READ(k−1)B at a low (logic 0) level. Also, the inverter 82 again inverts the inverted read command READ(k−1)B and outputs the read command READ(k−1) at a high level. The transmission gate 83 is turned on and the transmission gate 84 is turned off in response to the read command READ(k−1) at a high level and the inverted read command READ(k−1)B at a low level. The transmission gate 83 receives and outputs the flag signal S(k−1), and the latch circuit 85 latches and outputs the flag signal S(k−1).

Then, when the read command READ(k−1) is disabled to a low (logic 0) level, the inverter 81 inverts the read command READ(k−1) and outputs an inverted read command READ(k−1)B at a high (logic 1) level. Also, the inverter 82 again inverts the inverted read command READ(k−1)B and outputs the read command READ(k−1) at a low level. The transmission gate 83 is turned off and the transmission gate 84 is turned on in response to the read command READ(k−1) at a low level and the inverted read command READ(k−1)B at a high level. The transmission gate 84 receives the flag signal S(k−1) from the latch circuit 85 and outputs the flag signal S(k−1). The latch circuit 86 latches and outputs the flag signal S(k−1) output from the transmission gate 84.

Thereafter, when the read command READ(k) is enabled to a high (logic 1) level, the inverter 91 of the flag output unit 262 outputs an inverted read command READ(k)B at a low (logic 0) level. The transmission gate 93 is turned on in response to the read command READ(k) and the inverted read command READ(k)B, receives the flag signal S(k−1) from the latch circuit 86, and outputs the flag signal S(k−1). The latch circuit 94 latches and outputs the flag signal S(k−1) that was output from the transmission gate 93. The inverter 92 receives the flag signal S(k−1) from the latch circuit 94 and outputs the flag signal S(k−1) as the initial flag signal PS.

Figure 8:
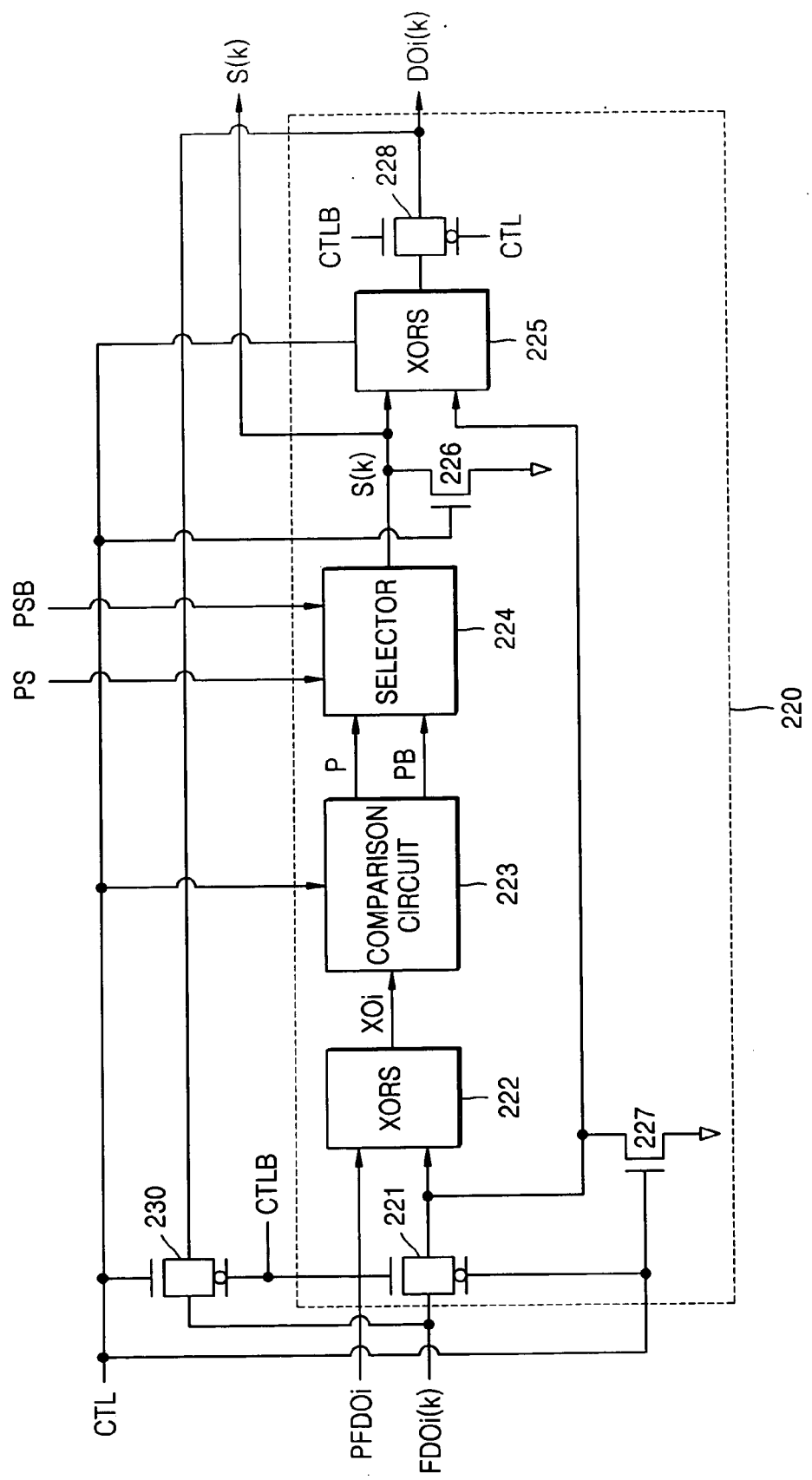
FIG. 8 is a block diagram illustrating an inversion unit and a bypass unit according to some embodiments of the present invention as shown in FIG. 3.

FIG. 8 is a detailed block diagram illustrating an inversion unit and a bypass unit according to some embodiments of the present invention as shown in FIG. 3. Referring to FIG. 8, the inversion unit 220 includes switches 221 and 228, first and second logic circuits 222 and 225, a comparison circuit 223, a selector 224, and NMOS transistors 226 and 227. The switches 221 and 228 are turned on or off in response to a control signal CTL and an inverted control signal CTLB. The switches 221 and 228 may preferably be implemented by transmission gates. The switch 221 receives and outputs input data FDOi(k) when turned on. Also, the first logic circuit 222 outputs an internal logic signal XOi (i=1 through 8) in response to initial input data PFDOi received from the controller 210 of FIG. 3 and the input data FDOi(k) received through the transmission gate 221. More particularly, the first logic circuit 222 determines whether each of the bits of the initial input data FDOi are toggled with respect to corresponding bits of the input data FDOi(k), and outputs the internal logic signal XOi according to the determined result. The comparison circuit 223 is enabled or disabled in response to the control signal CTL. The comparison circuit 223 outputs internal flag signals P and PB in response to the internal logic signal XOi when enabled. The selector 224 outputs any one of the internal flag signals P and PB as a flag signal S(k) in response to the initial flag signal PS and the inverted initial flag signal PSB.

The second logic circuit 225 is enabled or disabled in response to the control signal CTL. The second logic circuit 225 receives the input data FDOi(k) from the switch 221 when enabled, and inverts and outputs the input data FDOi(k) as an output data DOi(k) or outputs the input data FDOi(k) without inversion as the output data DOi(k) in response to the flag signal S(k). The switch 228 receives the output data DOi(k) from the second logic circuit 225 and outputs the output data DOi(k) when turned on.

The drain of the NMOS transistor 226 is connected to the output terminal of the selector 224, the source of the NMOS transistor 226 is connected to the ground voltage, and the control signal CTL is applied to the gate of the NMOS transistor 226. The NMOS transistor 226 is turned on or off in response to the control signal CTL and pre-discharges the output terminal of the selector 224 to the ground voltage level when the NMOS transistor 226 is turned on. As a result, the flag signal S(k) is changed to a low (logic 0) level.

Also, the drain of the NMOS transistor 227 is connected to the output terminal of the transmission gate 221, the source of the NMOS transistor 227 is connected to the ground voltage, and the control signal CTL is applied to the gate of the NMOS transistor 227. The NMOS transistor 227 is turned on or off in response to the control signal CTL. When the NMOS transistor 227 is turned on, the NMOS transistor 227 pre-discharges the output terminal of the transmission gate 221 to the ground voltage level.

The bypass unit 230 may preferably be implemented by a transmission gate with input and output terminals connected to respective input and output terminals of the inversion unit 220. The bypass unit 230 is turned on or off in response to the control signal CTL and the inverted control signal CTLB. When the bypass unit 230 is turned on, the bypass unit 230 receives and outputs the input data FDOi(k) as output data DOi(k). When the inversion unit 220 is enabled, the bypass unit 230 is disabled.

Figure 9:
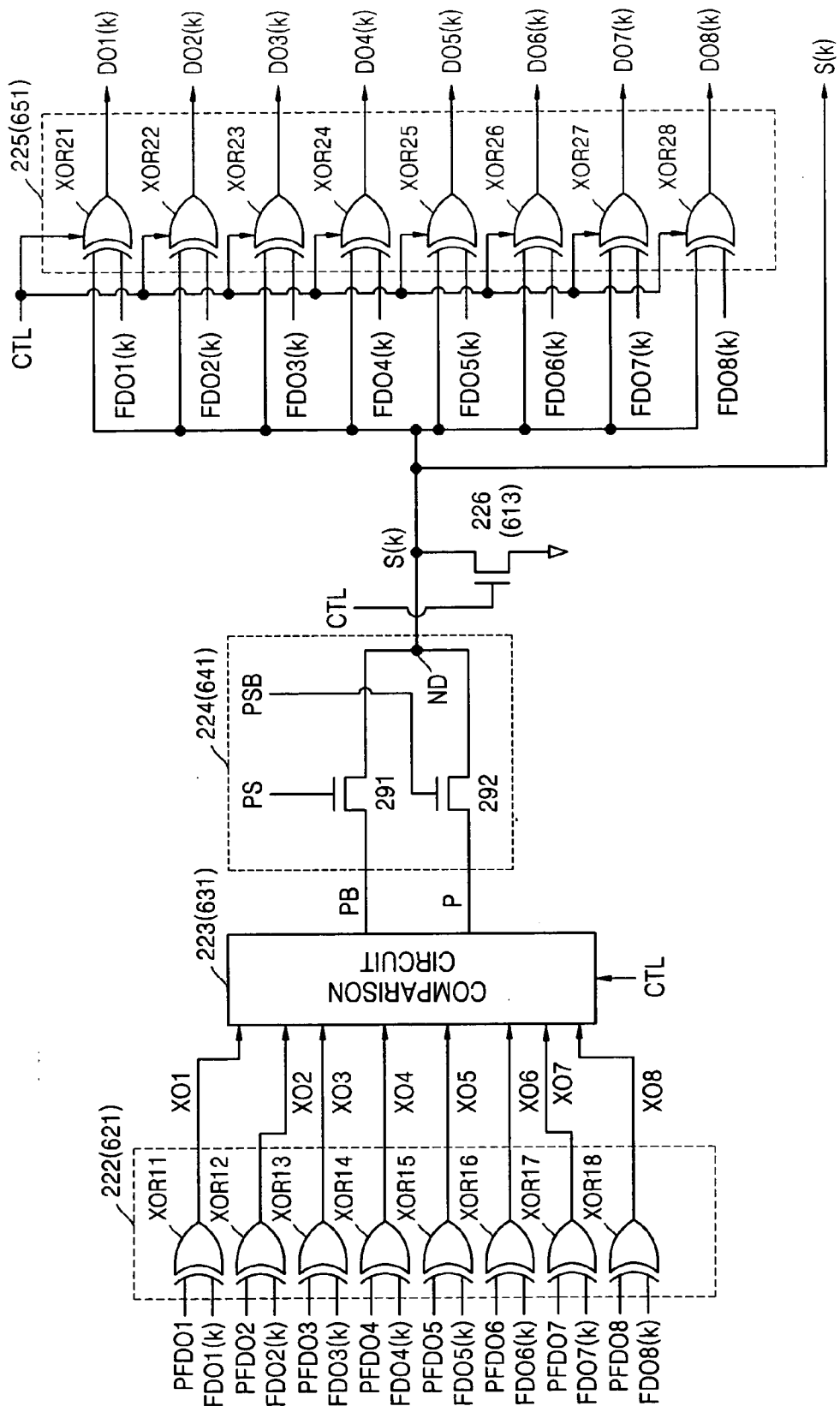
FIG. 9 is a schematic diagram illustrating first and second logic circuits, a comparison circuit and a selector according to some embodiments of the present invention as shown in FIG. 8.

FIG. 9 is a schematic diagram illustrating first and second logic circuits, a comparison circuit, and a selector according to some embodiments of the present invention as shown in FIG. 8. The first and second logic circuits 222 and 225 include 8 XOR gates, XOR11 through XOR18 and XOR21 through XOR28, respectively. The XOR gates XOR11 through XOR18 of the first logic circuit 222 perform an exclusive OR operation of the initial input data PFDO1 through PFDO8 and the input data FDO1(k) through FDO8(k), and output internal logic signals XO1 through XO8 as the exclusive OR-operated result. More particularly, the XOR gates XOR11 through XOR18 output the internal logic signals XO1 through XO8 with a low (logic 0) level when the input data FDO1(k) through FDO8(k) is the same as the initial input data PFDO1 through PFDO8. Also, the XOR gates XOR11 through XOR18 output internal logic signals XO1 through XO8 with a high (logic 1) level when the input data FDO1(k) through FDO8(k) are different from the initial input data PFDO1 through PFDO8, that is, when some bits of the input data FDO1(k) through FDO8(k) are toggled with respect to the corresponding bits of the initial input data PFDO1 through PFDO8. For example, if the input data FDO1(k) through FDO8(k) is "00000111" and the initial input data PFDO1 through PFDO8 is "11111011", the XOR gates XOR11 through XOR16 may output internal logic signals XO1 through XO6 with a high (logic 1) level, and the XOR gates XOR17 through XOR18 may output internal logic signals XO7 through XO8 with a low (logic 0) level.

The comparison circuit 223 is enabled or disabled in response to the control signal CTL. When the comparison circuit 223 is enabled, the comparison circuit 223 receives the internal logic signals XO1 through XO8, and outputs an internal flag signal P with a high level and an internal flag signal PB with a low level if half or more of the internal logic signals XO1 through XO8 (in this case, four or more of the internal logic signals XO1 through XO8) are at a high level. On the other hand, if less than half of the internal logic signals XO1 through XO8 (in this case, three or less of the internal logic signals XO1 through XO8) are at a high level, the comparison circuit 223 outputs an internal flag signal P with a low level and a internal flag signal PB with a high level. The comparison circuit 223 is described below in greater detail with reference to FIG. 10.

Still referring to FIG. 9, the selector 224 includes switches 291 and 292. The switches 291 and 292 are implemented by NMOS transistors. The internal flag signal PB is input to the drain of the NMOS transistor 291, the source of the NMOS transistor 291 is connected to a node ND, and the initial flag signal PS is input to the gate of the NMOS transistor 291. Also, the internal flag signal P is input to the drain of the NMOS transistor 292, the source of the NMOS transistor 292 is connected to the node ND, and the inverted initial flag signal PSB is input to the gate of the NMOS transistor 292.

The NMOS transistor 291 is turned on or off in response to the initial flag signal PS, and the NMOS transistor 292 is turned on or off in response to the inverted initial flag signal PSB. In other words, if the initial flag signal PS is at a high level, the NMOS transistor 291 is turned on and the NMOS transistor 292 is turned off. On the other hand, if the initial flag signal PS is at a low level, the NMOS transistor 291 is turned off and the NMOS transistor 292 is turned on.

If the NMOS transistor 291 is turned on, the NMOS transistor 291 outputs the internal flag signal PB as a flag signal S(k) to the node ND. If the NMOS transistor 292 is turned on, the NMOS transistor 292 outputs the internal flag signal P as the flag signal S(k) to the node ND. As a result, the selector 224 selects one of the internal flag signals P and PB and outputs the selected signal as the flag signal S(k), in response to the initial flag signal PS and the inverted initial flag signal PSB.

The NMOS transistor 226, whose drain is connected to the output terminal of the selector 224, is turned on or off in response to the control signal CTL. If the NMOS transistor 226 is turned on, the NMOS transistor 226 pre-discharges the output terminal of the selector 224 to the ground voltage level. As a result, the flag signal S(k) output from the node ND is changed to a low level.

The XOR gates XOR21 through XOR28 of the second logic circuit 225 are enabled or disabled in response to the control signal CTL. If the XOR gates XOR21 through XOR28 are enabled, the XOR gates XOR21 through XOR28 perform an exclusive OR operation of the input data FDO1(k) through FDO8(k) and the flag signal S(k), and outputs output data DO1(k) through DO8(k) as the exclusive-OR operated result. If the flag signal S(k) is at a high (logic 1) level, the output data DO1(k) through DO8(k) will be the inverted values of the input data FDO1(k) through FDO8(k). Alternatively, if the flag signal S(k) is at a low (logic 0) level, the output data DO1(k) through DO8(k) will be identical to the input data FDO1(k) through FDO8(k), i.e. inversion will not be performed.

Figure 10:
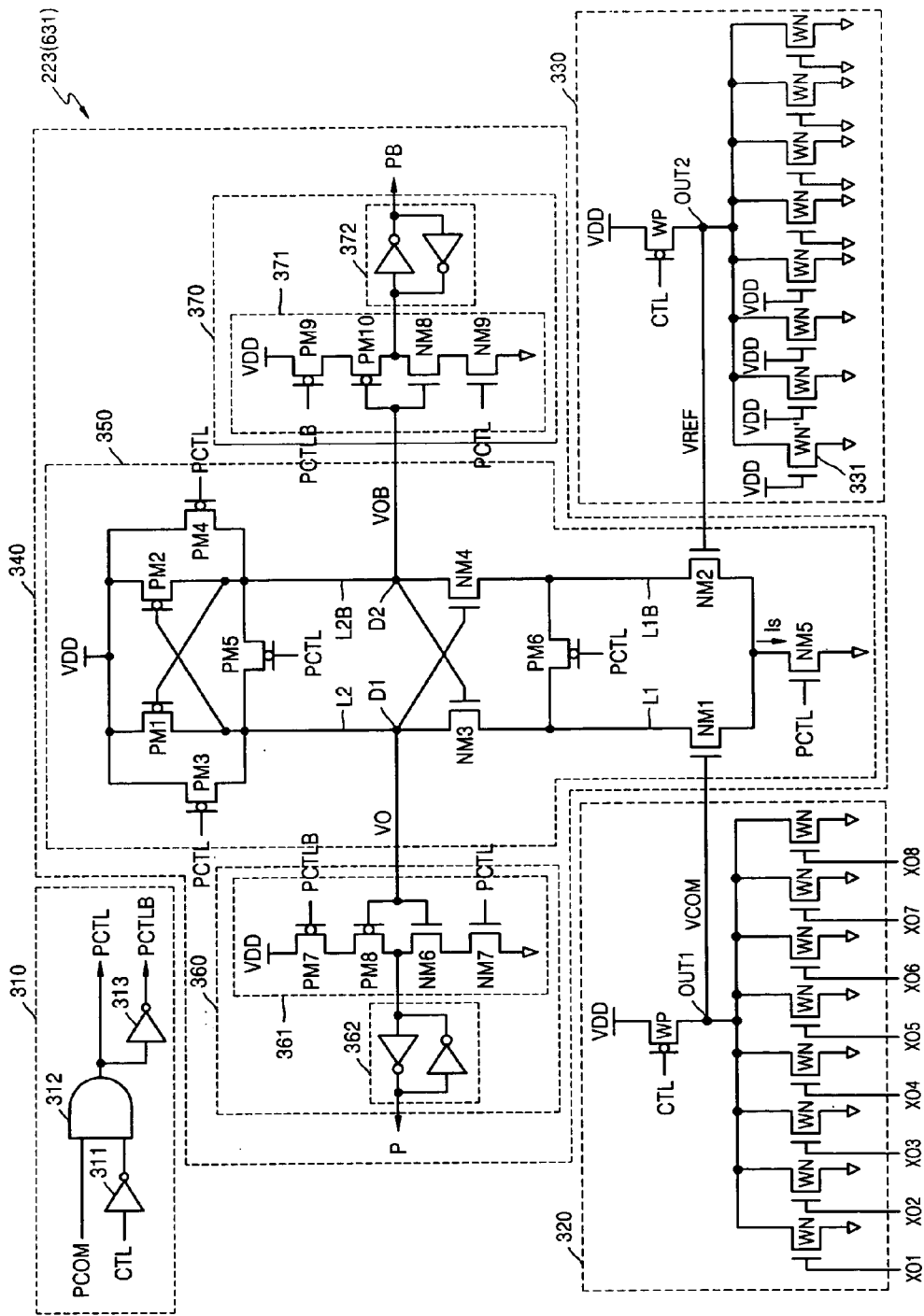
FIG. 10 is a schematic diagram illustrating a comparison circuit according to some embodiments of the present invention as shown in FIG. 9.

FIG. 10 is a schematic diagram of a comparison circuit according to some embodiments of the present invention as shown in FIG. 9. Referring to FIG. 10, the comparison circuit 223 includes a comparison control circuit 310, a comparison voltage generator circuit 320, a reference voltage generator circuit 330, and an internal flag signal generator circuit 340.

The comparison control circuit 310 outputs a comparison control signal PCTL and an inverted comparison control signal PCTLB in response to a control signal CTL and a second internal control signal PCOM. The second internal control signal PCOM is generated by a separate internal control circuit (not shown) in response to a read command. The comparison control circuit 310 includes inverters 311 and 313 and an AND gate 312. The inverter 311 inverts the control signal CTL, and the AND gate 312 outputs the comparison control signal PCTL in response to the second internal control signal PCOM and an output signal of the inverter 311. The inverter 313 inverts the comparison control signal PCTL, and outputs an inverted comparison control signal PCTLB.

The comparison voltage generator circuit 320 generates a comparison voltage VCOM in response to the internal logic signals XO1 through XO8 output from the first logic circuit 222 of FIG. 9, and outputs the comparison voltage VCOM to an output node OUT1. The comparison voltage generator circuit 320 includes a PMOS transistor WP and eight NMOS transistors WN.

Still referring to FIG. 10, the source of the PMOS transistor WP is connected to the internal voltage VDD, the drain of the PMOS transistor WP is connected to the output node OUT1, and the control signal CTL is applied to the gate of the PMOS transistor WP. The PMOS transistor WP is turned on or off in response to the control signal CTL. The drains of the eight NMOS transistors WN are connected to the output node OUT1 and the sources of the eight NMOS transistors WN are connected to a ground. Also, the internal logic signals XO1 through XO8 are respectively input to the gates of the eight NMOS transistors WN. The NMOS transistors WN are turned on or off in response to the internal logic signals XO1 through XO8. As the number of active NMOS transistors WN increases, the level of the comparison voltage VCOM becomes lower.

The reference voltage generator circuit 330 generates and outputs a predetermined reference voltage VREF to an output node OUT2. The reference voltage generator circuit 330 includes a PMOS transistor WP and eight NMOS transistors WN and WN'. The source of the PMOS transistor WP is connected to the internal voltage VDD, the drain of the PMOS transistor WP is connected to the output node OUT2, and the control signal CTL is applied to the gate of the PMOS transistor WP. The PMOS transistor WP is turned on or off in response to the control signal CTL.

The drains of the eight NMOS transistors WN and WN' are connected to the output node OUT2, and the sources of the eight NMOS transistors WN and WN' are connected to ground. The gates of four NMOS transistors WN of the eight NMOS transistors WN and WN' are connected to ground, and the gates of the remaining four NMOS transistors WN and WN' are connected to the internal voltage VDD. The size of the NMOS transistor WN' may preferably be about one-half of that of the NMOS transistor WN.

The level of the reference voltage VREF is decided by the NMOS transistors WN and WN' whose gates are connected to the internal voltage VDD. More particularly, the reference voltage VREF is a voltage generated at the output node OUT2 when three NMOS transistors WN and the NMOS transistor WN' are turned on.

Accordingly, if at least four NMOS transistors WN are turned on in the comparison voltage generator circuit 320, the level of the comparison voltage VCOM may be lower than that of the reference voltage VREF.

The internal flag signal generator circuit 340 includes a differential amplifier circuit 350 and output circuits 360 and 370. The differential amplifier circuit 350 includes differential NMOS transistors NM1 and NM2, amplification PMOS transistors PM1 and PM2, amplification NMOS transistors NM3 and NM4, reset PMOS transistors PM3 through PM6, and a current source NMOS transistor NM5.

The drains of the differential NMOS transistors NM1 and NM2 are respectively connected to first output lines L1 and L1B, and the comparison voltage VCOM and reference voltage VREF are respectively input to the gates of the differential NMOS transistors NM1 and NM2. The differential NMOS transistors NM1 and NM2 compare the comparison voltage VCOM with the reference voltage VREF and output signals VO and VOB to the first output lines L1 and L1B.

The amplification PMOS transistors PM1 and PM2 are cross-coupled to second output lines L2 and L2B, and the sources of the amplification PMOS transistors PM1 and PM2 are connected to the internal voltage VDD. The amplification NMOS transistors NM1 and NM2 are also cross-coupled to the second output lines L2 and L2B, and the sources of the amplification NMOS transistors NM1 and NM2 are connected respectively to the first output lines L1 and L1B. The amplification PMOS transistors PM1 and PM2 and the amplification NMOS transistors NM1 and NM2 amplify the output signals VO and VOB transferred to the first output lines L1 and L1B, and output the amplified result to the second output lines L2 and L2B. The amplified output signals VO and VOB are output respectively from nodes D1 and D2 of the second output lines L2 and L2B.

The comparison control signal PCTL is input to the gates of the reset PMOS transistors PM3 through PM6. The sources of the reset PMOS transistors PM3 and PM4 are connected to the internal voltage VDD, and the drains of the reset PMOS transistors PM3 and PM4 are respectively connected to the second output lines L2 and L2B. The source and drain of the reset PMOS transistor PM5 are respectively connected to the second output lines L2 and L2B, and the source and drain of the reset PMOS transistor PM6 are respectively connected to the first output lines L1 and L1B. The reset PMOS transistors PM3 through PM6 are turned on or off in response to the comparison control signal PCTL. When the reset PMOS transistors PM3 through PM6 are turned on, the reset PMOS transistors PM3 through PM6 pre-charge the voltage levels of the first output lines L1 and L1B and the second output lines L2 and L2B to the internal voltage level VDD.

The drain of the current source NMOS transistor NM5 is connected to the sources of the differential NMOS transistors NM1 and NM2, and the source of the current source NMOS transistor NM5 is connected to the ground voltage. Also, the comparison control signal PCTL is input to the gate of the current source NMOS transistor NM5. The current source NMOS transistor NM5 is turned on or off in response to the comparison control signal PCTL and controls the operation of the differential amplification circuit 350 using a source current Is.

The output circuits 360 and 370 include inverter circuits 361 and 371 and latch circuits 362 and 372, respectively. The inverter circuit 361 includes PMOS transistors PM7 and PM8 and NMOS transistors NM6 and NM7. The source of the PMOS transistor PM7 is connected to the internal voltage VDD and the drain of the PMOS transistor PM7 is connected to the source of the PMOS transistor PM8. Also, the inverted comparison control signal PCTLB is input to the gate of the PMOS transistor PM7.

The gates of the PMOS transistor PM8 and the NMOS transistor NM6 are connected to the node D1. The drain of the NMOS transistor NM7 is connected to the source of the NMOS transistor NM6, and the source of the NMOS transistor NM7 is connected to the ground voltage. The comparison control signal PCTL is input to the gate of the NMOS transistor NM7. Also, the drains of the PMOS transistor PM8 and the NMOS transistor NM6 are connected to the input terminal of the latch circuit 362. The inverter circuit 361 inverts and outputs an output signal VO that is output from the node D1 in response to the comparison control signal PCTL and the inverted comparison control signal PCTLB. The latch circuit 362 latches an output signal of the inverter circuit 361 and outputs the latched signal as an internal flag signal P.

The inverter circuit 371 includes PMOS transistors PM9 and PM10 and NMOS transistors NM8 and NM9. The source of the PMOS transistor PM9 is connected to the internal voltage VDD, and the drain of the PMOS transistor PM9 is connected to the source of the PMOS transistor PM10. Also, the inverted comparison control signal PCTLB is input to the gate of the PMOS transistor PM9. The gates of the PMOS transistor PM10 and the NMOS transistor NM8 are connected to the node D2. The drain of the NMOS transistor NM9 is connected to the source of the NMOS transistor NM8 and the source of the NMOS transistor NM9 is connected to the ground voltage. The comparison control signal PCTL is input to the gate of the NMOS transistor NM9. Also, the drains of the PMOS transistor PM10 and the NMOS transistor NM8 are connected to the input terminal of the latch circuit 372. The inverter circuit 371 inverts and outputs the output signal VOB that is output from the node D2 in response to the comparison control signal PCTL and the inverted comparison control signal PCTLB. The latch circuit 372 latches an output signal of the inverter circuit 371 and outputs the latched signal as an internal flag signal PB. As a result, complementary internal flag signals P and PB are output from the internal flag signal generator circuit 340.

Further operations of the comparison circuit 223 will now be described with reference to FIG. 10. The comparison control circuit 310 outputs the comparison control signal PCTL and the inverted comparison control signal PCTLB in response to the second internal control signal PCOM and the control signal CTL. For example, if the second internal control signal PCOM is at a high level and the control signal CTL is at a low level, the comparison control circuit 310 outputs a comparison control signal PCTL at a high level and an inverted comparison control signal PCTLB at a low level.

The comparison voltage generator circuit 320 and the reference voltage generator circuit 330 are enabled in response to the control signal CTL. The comparison voltage generator circuit 320 generates a comparison voltage VCOM in response to internal logic signals XO1 through XO8. The reference voltage generator circuit 330 generates a predetermined reference voltage VREF. If half of more of the internal logic signals XO1 through XO8, (in this case, four or more of the internal logic signals XO1 through XO8) are at a high level, the comparison voltage VCOM may be lower than the reference voltage VREF. On the other hand, if less than half of the internal logic signals XO1 through XO8, (in this case, three or less of the internal logic signals XO1 through XO8) are at a high level, the comparison voltage VCOM may be higher than the reference voltage VREF. In FIG. 10, where half or more of the internal logic signals XO1 through XO8 (that is, four or more of the internal logic signals XO1 through XO8) are at a high level, the comparison voltage VCOM is lower than the reference voltage VREF.

Still referring to FIG. 10, the current source NMOS transistor NM5 of the differential amplifier circuit 350 is turned on and the reset PMOS transistors PM3 through PM6 are turned off in response to the comparison control signal PCTL. The differential NMOS transistors NM1 and NM2 compare the comparison voltage VCOM with the reference voltage VREF and output signals VO and VOB to the first output lines L1 and L1B. Since the comparison voltage VCOM is lower than the reference voltage VREF, an on-resistance of the differential NMOS transistor NM1 is greater than that of the differential NMOS transistor NM2. As a result, the level of the output signal VOB may be lower than the level of the output signal VO.

The amplifier PMOS transistors PM1 and PM2 and the amplifier NMOS transistors NM1 and NM2 amplify the output signals VO and VOB transferred to the first output lines L1 and L1B, and output the amplified signals to the second output lines L2 and L2B. Thereafter, an output signal VO at a high level is output from a node D1 of the second output line L2. An output signal VOB at a low level is output from a node D2 of the second output line L2B.

The inverter circuits 361 and 371 of the output circuits 360 and 370 respectively invert and output the output signals VO and VOB in response to the comparison control signal PCTL and the inverted comparison control signal PCTLB. Also, the latch circuits 362 and 372 of the output circuits 360 and 370 respectively latch output signals of the inverter circuits 361 and 371, and respectively output the latched signals as internal flag signals P and PB. The latch circuit 362 latches an output signal of the inverter circuit 361 at a low level and outputs an internal flag signal P at a high level. Also, the latch circuit 372 latches an output signal of the inverter circuit 371 at a high level and outputs an internal flag signal PB at a low level.

If the latch circuits 362 and 372 terminate the latching process, the second internal control signal PCOM is disabled to a low level. The comparison control circuit 310 outputs a comparison control signal PCTL at a low level in response to the second internal control signal PCOM at a low level and the control signal CTL at a low level. The reset PMOS transistors PM3 through PM6 are turned on in response to the comparison control signal PCTL. The reset PMOS transistors PM3 through PM6 pre-charge the voltage levels of the first output lines L1 and L1B and the second output lines L2 and L2B to the internal voltage level VDD, for the comparison operation of the differential amplifier circuit 350. Also, the current source NMOS transistors NM5 is turned off in response to the comparison control signal PCTL. Also, if the comparison voltage signal PCTL is changed to a low level, the PMOS transistors PM7 and PM9 and the NMOS transistors NM7 and NM9 are turned off and the inverter circuits 361 and 371 are disabled.

As a result, although the second output lines L2 and L2B are pre-charged to the internal voltage level VDD, an output path to the latch circuits 362 and 372 is cut off at the nodes D1 and D2 by the inverter circuits 361 and 371. Accordingly, the output signals VO and VOB changed to the internal voltage level VDD do not influence the internal flag signals P and PB, which are previously latched and output by the latch circuits 362 and 372.

Meanwhile, when the control signal CTL is enabled to a high level, the PMOS transistors WP of the comparison voltage generator circuit 320 and the reference voltage generator circuit 330 are turned off. As a result, the comparison voltage generator circuit 320 and the reference voltage generator circuit 330 do not operate. Also, the comparison control circuit 310 maintains the comparison control signal PCTL at a low level in response to the second internal control signal PCOM at a low level and the control signal CTL at a high level.

Figure 11:
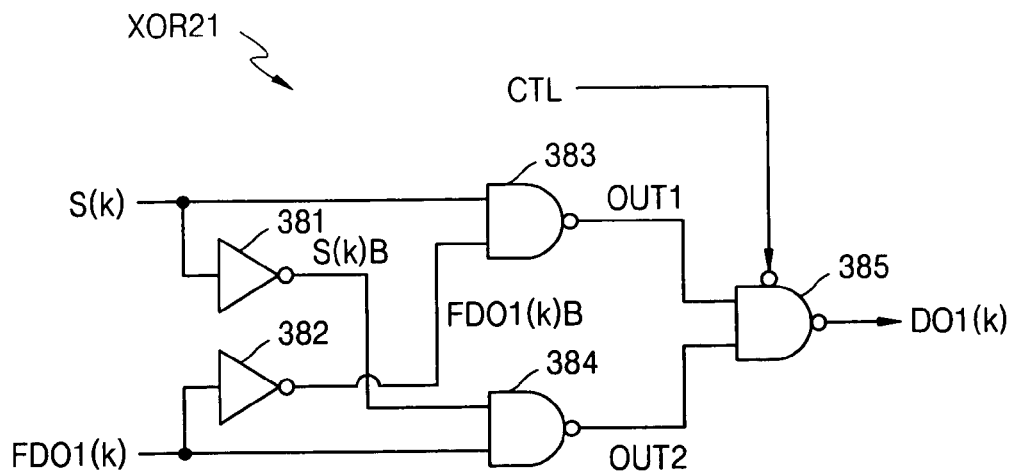
FIG. 11 is a schematic diagram illustrating XOR gates of a second logic circuit according to some embodiments of the present invention as shown in FIG. 9.

FIG. 11 is a schematic diagram showing XOR gates of a second logic circuit according to some embodiments of the present invention as shown in FIG. 9. The configuration and operations of XOR gates XOR22 through XOR28 may be substantially similar to those of XOR gate XOR2; therefore the following descriptions will be based on the operation of XOR gate XOR21. Referring now to FIG. 11, the XOR gate XOR2 includes inverters 381 and 382 and first through third NAND gates 383 through 385. The inverter 381 inverts a flag signal S(k) received from the selector 224 of FIG. 9 and the inverter 382 inverts input data FDO1(k) received through the switch 221 of FIG. 9. The first NAND gate 383 outputs a first output signal OUT1 in response to the flag signal S(k) and inverted input data FDO1(k)B. The second NAND gate 384 outputs a second output signal OUT2 in response to the input data FDO1(k) and an inverted flag signal S(k)B. The third NAND gate 385 is enabled or disabled in response to the control signal CTL. When the third NAND gate 385 is enabled, the third NAND gate 385 outputs output data DO1(k) in response to the first output signal OUT1 and the second output signal OUT2. An exemplary relationship between a set of control signals CTL, flag signals S(k), input data FDO1(k), first and second output signals OUT1 and OUT2, and output data DO1(k) according to some embodiments of the present invention is shown in Table 1.

TABLE 1

| CTL | S(k) | FDO1(k) | OUT1 | OUT2 | DO1(k) |
|---|---|---|---|---|---|
| 0 | 0 | 0 | 1 | 1 | 0 |
|   | 0 | 1 | 1 | 0 | 1 |
|   | 1 | 0 | 0 | 1 | 1 |
|   | 1 | 1 | 1 | 1 | 0 |
| 1 | 0 | 0 | 1 | 1 | FLOATING |
|   | 0 | 1 | 1 | 0 |   |
|   | 1 | 0 | 0 | 1 |   |
|   | 1 | 1 | 1 | 1 |   |

Referring to Table 1, when the control signal CTL is at a low (logic 0) level, the XOR gate XOR21 is enabled and outputs the output data DO1(k). Also, when the control signal CTL is at a high (logic 1) level, the XOR gate XOR21 is disabled and does not output the output data DO1(k). Also, the XOR gate XOR21 outputs the input data FDO1(k) as the output data DO1(k) without inversion when the flag signal S(k) is "0", and inverts and outputs the input data FDO1(k) as the output data DO1(k) when the flag signal S(k) is "1".

Figure 12:
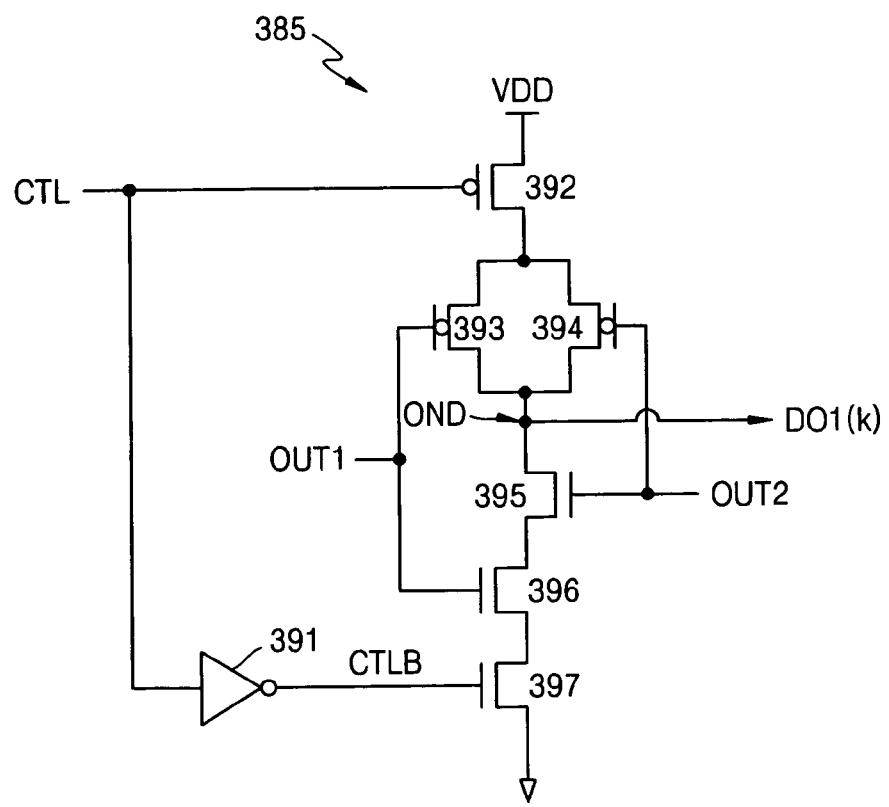
FIG. 12 is a schematic diagram illustrating a third NAND gate according to some embodiments of the present invention as shown in FIG. 11.

FIG. 12 is a schematic diagram of a third NAND gate according to some embodiments of the present invention as shown in FIG. 11. Referring now to FIG. 12, the third NAND gate 385 includes an inverter 391, PMOS transistors 392 through 394, and NMOS transistors 395 through 397. The inverter 391 inverts the control signal CTL and outputs an inverted control signal CTLB. The source of the PMOS transistor 392 is connected to the internal voltage VDD, and the control signal CTL is input to the gate of the PMOS transistor 392. The PMOS transistor 392 is turned on or off in response to the control signal CTL. The sources of the PMOS transistors 393 and 394 are connected to the drain of the PMOS transistor 392, and the drains of the PMO transistors 393 and 394 are connected to an output node OND. Also, the first output signal OUT1 is input to the gate of the PMOS transistor 393, and the second output signal OUT2 is input to the gate of the PMOS transistor 394. The drain of the NMOS transistor 395 is connected to the output node OND, and the second output signal OUT2 is input to the gate of the NMOS transistor 395. The drain of the NMOS transistor 396 is connected to the source of the NMOS transistor 395, and the first output signal OUT1 is input to the gate of the NMOS transistor 396. The drain of the NMOS transistor 397 is connected to the source of the NMOS transistor 396, the source of the NMOS transistor 397 is connected to the ground voltage, and an inverted control signal CTLB is input to the gate of the NMOS transistor 397. The NMOS transistor 397 is turned on or off in response to the inverted control signal CTLB. The output data DO1(k) is output from the output node OND.

Referring to FIG. 12 and Table 1, the operation of the third NAND gate 385 will now be described in greater detail. If the control signal CTL is at a low level, the PMOS transistor 392 and the NMOS transistor 397 are turned on. When both the first and second output signals OUT1 and OUT2 are at a high level, the PMOS transistors 393 and 394 are turned off, and the NMOS transistors 395 and 396 are turned on. As a result, the output data DO1(k) is output from the output node OND at a low level.

Also, if the first output signal OUT1 is at a high level and the second output signal OUT2 is at a low level, the NMOS transistor 396 and the PMOS transistor 394 are turned on, and the PMOS transistor 393 and the NMOS transistor 395 are turned off. As a result, the output data DO1(k) is output from the output node OND at a high level.

If the first output signal OUT1 is at a low level and the second output signal OUT2 is at a high level, the PMOS transistor 393 and the NMOS transistor 395 are turned on, and the NMOS transistor 396 and the PMOS transistor 394 are turned off. As a result, the output data DO1(k) is output from the output node OND at a high level.

Meanwhile, when the control signal CTL is at a high level, the PMOS transistor 392 and the NMOS transistor 397 are turned off. As a result, the XOR gate 385 is disabled and the output node OND is floating.

Figure 13:
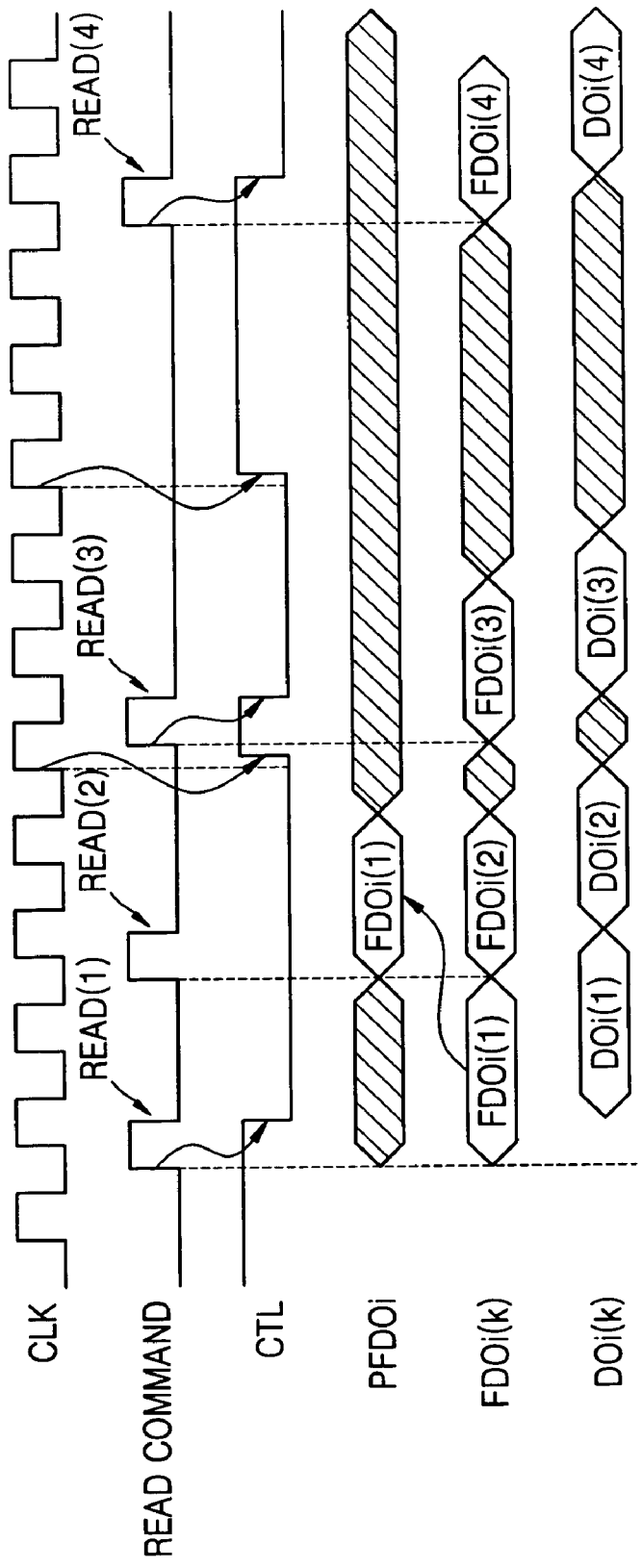
FIG. 13 is a timing diagram illustrating input and output signals of a data inversion circuit according to some embodiments of the present invention as shown in FIG. 3.

Referring now to FIGS. 2 through 13, detailed operations of the data inversion circuit 200 will be described. FIG. 13 is a timing diagram illustrating input and output signals of a data inversion circuit according to some embodiments of the present invention as shown in FIG. 3. FIG. 13 illustrates a timing diagram for a memory cell array 110 which sequentially outputs input data FDOi(1) through FDOi(4) in response to sequential read commands READ(1) through READ(4). Table 2 illustrates an exemplary relationship between values of the input data FDOi(1) through FDOi(4) output in response to the read commands READ(1) through READ(4).

TABLE 2

| Read command | Input data | Bit value | | | | | | | |
|---|---|---|---|---|---|---|---|---|---|
| | | i = 1 | i = 2 | i = 3 | i = 4 | i = 5 | i = 6 | i = 7 | i = 8 |
| READ(1) | FDOi(1) | 1 | 1 | 1 | 1 | 1 | 1 | 1 | 0 |
| READ(2) | FDOi(2) | 1 | 1 | 0 | 0 | 0 | 0 | 0 | 0 |
| READ(3) | FDOi(3) | 1 | 1 | 1 | 1 | 1 | 0 | 0 | 0 |
| READ(4) | FDOi(4) | 1 | 0 | 0 | 0 | 0 | 0 | 0 | 0 |

Referring now to FIG. 3, FIG. 4 and FIG. 13, at an initial state, the control signal generator 240 of the controller 210 enables a control signal CTL to a high (logic 1) level. If the control signal CTL is at a high level, the bypass unit 230 is enabled and the inversion unit 220 is disabled. The bypass unit 230 outputs input data FDOi(1) "11111110" as output data DOi(1). Accordingly, the output data DOi(1) is "11111110". Also, the inversion unit 220 outputs a flag signal S(1) with a low (logic 0) level to indicate that the output is not inverted. More particularly, referring to FIG. 8, a NMOS transistor 226 of the inversion unit 220 is turned on in response to the control signal CTL and pre-discharges an output terminal of the selector 224 to a ground voltage level. As a result, the flag signal S(1) is changed to a low level.

The control signal generator 240 disables the control signal CTL to a low (logic 0) level when the read command READ(1) is received. Also the initial input data generator 250 of the controller 210 latches and stores the input data FDOi(1) in response to the control signal CTL and the read command READ(1). In addition, when the read command READ(1) is received, the initial flag signal generator 260 of the controller 210 latches and stores the flag signal S(1) in response to the control signal CTL and the read command READ(1).

Thereafter, when the following read command READ(2) is received, the control signal generator 240 determines whether a read interval between receipt of the read command READ(1) and receipt of the read command READ(2) exceeds a predetermined number of clock cycles. In this case, the predetermined number of clock cycles is two. In FIG. 13, since the read command READ(2) is received within two clock cycles from when the read command READ(1) was received, the control signal generator 240 maintains the control signal CTL at a low (logic 0) level. Also, the initial input data generator 250 outputs the stored input data FDOi(1) as initial input data PFDOi when the read command READ(2) is received. The initial flag signal generator 260 also outputs the stored flag signal S(1) as an initial flag signal PS when the read command READ(2) is received, and further outputs an inverted initial flag signal PSB.

Since the control signal CTL is at a low (logic 0) level, the inversion unit 220 is enabled and the bypass unit 230 is disabled. The inversion unit 220 receives the read input data FDOi(2) read in response to the read command READ(2). Also, the inversion unit 220 receives the initial input data PFDOi from the initial input data generator 250, and receives the initial flag signal PS and the inverted initial flag signal PSB from the initial flag signal generator 260.

Referring now to FIG. 9, the first logic circuit 222 of the inversion unit 220 determines whether each of the bits of the input data FDOi(2) are toggled with respect to corresponding bits of the initial input data PFDOi, and outputs internal logic signals XO1 through XO8 according to the determined result. Since the input data FDO1(2) through FDO8(2) is "11000000" and the initial input data PFDO1 through PFDO8 is "11111110", the XOR gates X11 through X18 of the first logic circuit 222 output internal logic signals XO1 through XO8 of "00111110".

Thereafter, the comparison circuit 223 of the inversion unit 220 is enabled in response to the control signal CTL, and outputs internal flag signals P and PB in response to the internal logic signals XO1 through XO8. More particularly, since the internal logic signals XO1 through XO8 are "00111110", i.e. since half or more of the internal logic signals XO1 through XO8 are at a high level, the comparison circuit 223 outputs an internal flag signal P at a high level and an internal flag signal PB at a low level. When the internal flag signal P is at a high level, this indicates that the number of toggled bits between the input data FDO1(2) through FDO8(2) and the initial input data PFDO1 through PFDO8 exceeds half of the number of total bits.

The selector 224 of the inversion unit 220 selects one of the internal flag signals P and PB and outputs the selected signal as a flag signal S(2), in response to the initial flag signal PS and the inverted initial flag signal PSB. In this case, since the initial flag signal PS is at a low level, the NMOS transistor 292 of the selector 224 is turned on and outputs an internal flag signal P at a high level as the flag signal S(2).

The second logic circuit 225 of the inversion unit 220 is enabled in response to the control signal CTL, performs an exclusive OR operation of the input data FDO1(2) through FDO8(2) and the flag signal S(2), and outputs 8-bit output data DO1(2) through DO8(2) as the exclusive OR operated result. More particularly, since the flag signal S(2) is at a high level, XOR gates XOR21 through XOR28 of the second logic circuit 225 invert the input data FDO1(2) through FDO8(2), and output the inverted result as the output data DO1(2) through DO8(2). Accordingly, the output data DO1(2) through DO8(2) is changed to "00111111".

The initial input data generator 250 latches and stores the input data FDOi(2) in response to the control signal CTL and the read command READ(2). Also, the initial flag signal generator 260 also latches and stores the flag signal S(2) in response to the control signal CTL and the read command READ(2).

Thereafter, when the read command READ(3) is received, the control signal generator 240 determines whether the read interval between receipt of the read command READ2 and receipt of the read command READ(3) exceeds 2 clock cycles. In FIG. 13, the read command READ(3) is received more than two clock cycles after receipt of read command READ(2). Accordingly, the control signal generator 240 enables the control signal CTL in response to the rising edge of the third clock signal CLK after the read command READ(2) is received. In other words, the control signal CTL is enabled when the read interval exceeds two clock cycles. The control signal generator 240 disables the control signal CTL when the read command READ(3) is received.

When the control signal CTL is enabled, the bypass unit 230 is enabled and outputs the input data FDOi(3) "11111000" without inversion as output data DOi(3). Accordingly, the output data DOi(3) is changed to "11111000". At this time, the inversion unit 220 is disabled, and a flag signal S(3) with a low (logic 0) level is output.

As such, when the read command READ(3) is not received within two clock cycles, the data output unit 252 of the initial input data generator 250 is disabled and does not output initial input data PFDi. Also, the flag output unit 262 of the initial flag signal generator 260 is disabled and does not output initial flag signal PS and the inverted initial flag signal PSB.

The data latch unit 251 of the initial input data generator 250 latches and stores the input data FDOi(3) in response to the control signal CTL and the read command READ(3). Also, the flag latch unit 261 of the initial flag signal generator 260 latches and stores the flag signal S(3) in response to the control signal CTL and the read command READ(3).

When the read command READ(4) is received, the control signal generator 240 determines whether the read interval between receipt of the read command READ(3) and receipt of the read command READ(4) exceeds two clock cycles. In FIG. 13, the read command READ(4) is received more than two clock cycles after receipt of the read command READ(3). Accordingly, the control signal generator 240 enables the control signal CTL in response to the rising edge of the third clock signal CLK after the read command READ(3) is received. In other words, the control signal CTL is again enabled when the read interval exceeds two clock cycles. The control signal generator 240 disables the control signal CTL in response to the read command READ(4).

When the control signal CTL is enabled, the bypass unit 230 is enabled and outputs the input data FDOi(4) "10000000" as output data DOi(4) without inversion.

Accordingly, the output data DOi(4) becomes "10000000". At this time, the inversion unit 220 is disabled, and a flag signal S(4) is output at a low (logic 0) level.

The initial input data generator 250 latches and stores the input data FDOi(4) in response to the control signal CTL and the read command READ(4). Also, the initial flag signal generator 260 latches and stores the flag signal S(4) in response to the control signal CTL and the read command READ(4).

Exemplary values of output data DOi(1) through DOi(4) from the data inversion circuit 200, as well as corresponding input data FDOi(1) through FDOi(4) and values of flag signals S(1) through S(4), are provided in Table 3.

TABLE 3

| Output data | Bit value | | | | | | | | Flag signal | Bit value |
|---|---|---|---|---|---|---|---|---|---|---|
| | i=1 | i=2 | i=3 | i=4 | i=5 | i=6 | i=7 | i=8 | | |
| DOi(1) | 1 | 1 | 1 | 1 | 1 | 1 | 1 | 0 | S(1) | 0 |
| DOi(2) | 0 | 0 | 1 | 1 | 1 | 1 | 1 | 1 | S(2) | 1 |
| DOi(3) | 1 | 1 | 1 | 1 | 1 | 0 | 0 | 0 | S(3) | 0 |
| DOi(4) | 1 | 0 | 0 | 0 | 0 | 0 | 0 | 0 | S(4) | 0 |

As described above, a data inversion circuit 200 according to some embodiments of the present invention can bypass and output corresponding input data as output data, as the data output circuit (not shown) of the semiconductor memory device 100 may be in a stable state when the read interval exceeds a predetermined number of clock cycles. On the other hand, if the read interval is less than or equal to the predetermined number of clock cycles, the data inversion circuit 200 can compare the current input data with input data read in response to a previous read command, and decide whether or not to invert the current input data according to the compared result. In other words, the data inversion circuit 200 may disable an inversion operation when a data non-read interval (shown by an oblique lined portion in FIG. 13) is greater than a predetermined period, such that input data may be processed at a higher speed.

Figure 14:
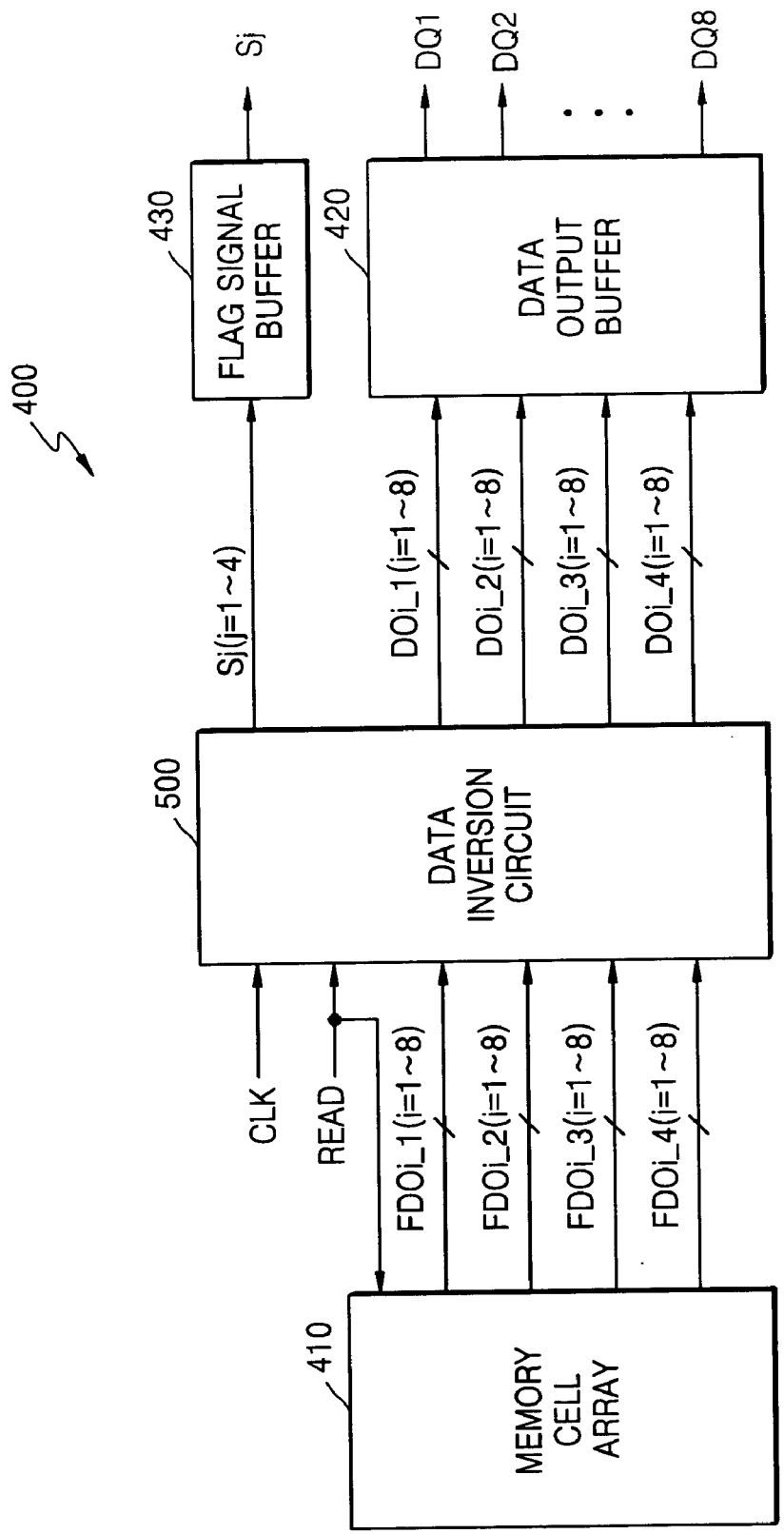
FIG. 14 is a block diagram illustrating a semiconductor memory device including a data inversion circuit according to further embodiments of the present invention.

FIG. 14 is a block diagram illustrating a semiconductor memory device including a data inversion circuit according to further embodiments of the present invention. In FIG. 14, a semiconductor memory device 400 includes 8 DQ pads DQ1 through DQ8 and employs a 4-bit pre-fetch scheme. Referring now to FIG. 14, the semiconductor memory device 400 includes a memory cell array 410, a data inversion circuit 500, a data output buffer 420 and a flag signal buffer 430. The semiconductor memory device 400 may be similar to the semiconductor memory device 100 shown in FIG. 2, with the exception that the semiconductor memory device 100 outputs single data in response to a single read command, while the semiconductor memory device 400 adopts a multi-bit pre-fetch scheme which simultaneously outputs a plurality of data in response to a single read command. More particularly, the semiconductor memory device 400 uses a 4-bit pre-fetch scheme.

Still referring to FIG. 14, the memory cell array 410 simultaneously pre-fetches first through fourth input data FDOi_1 through FDOi_4 (i=1 through 8) in response to a read command READ, and outputs the first through fourth data FDOi_1 through FDOi_4 in parallel. As a result, data of total 8*4 bits (that is, 32 bits) is output from the memory cell array 410 in response to the read command READ. In FIG. 14, a numeral following '_' is provided to distinguish 4-bit data that is to be output to the same DQ pad. In other words, FDOi_1 represents data of 1 bit which may be output from an i-th DQ pad first, and FDOi_2 represents data of 1 bit which may be output from the i-th DQ pad second. Likewise, FDOi_3 represents data of 1 bit which may be output from the i-th DQ pad third, and FDOi_4 represents data of 1 bit which may be output from the i-th DQ pad fourth.

Also, the data inversion circuit 500 receives a clock signal CLK and the read command READ, and receives the first through fourth input data FDOi_1 through FDOi_4 from the memory cell array 410. The data inversion circuit 500 performs inversion/non-inversion of the first input data FDOi_1 or bypasses and outputs the first input data FDOi_1 as first output data DOi_1 (i=1 through 8), in response to the clock signal CLK and the read command READ. Also, the data inversion circuit 500 decides whether or not the second through fourth input data FDOi_2 through FDOi_4 should be inverted, and inverts and outputs the second through fourth input data FDOi_2 through FDOi_4(i=1 through 8) or outputs the second through fourth input data FDOi_2 through FDOi_4 without inversion as second through fourth output data DOi_2 through DOi_4 (i=1 through 8), according to the decided result. Also, the data inversion circuit 500 outputs a flag signal Sj (j=1 through 4) indicating whether or not the first through fourth input data FDOi_1 through FDOi_4 are inverted.

The data output buffer 420 receives the first through fourth output data DOi_1 through DOi_4 output from the data inversion circuit 500 and externally outputs the first through fourth output data DOi_1 through DOi_4 from the semiconductor memory device 400 via the first through eighth DQ pads DQ1 through DQ8. The flag signal Sj (j=1 through 4) output from the data inversion circuit 500 is also output to an external source through the flag signal buffer 430.

Figure 15:
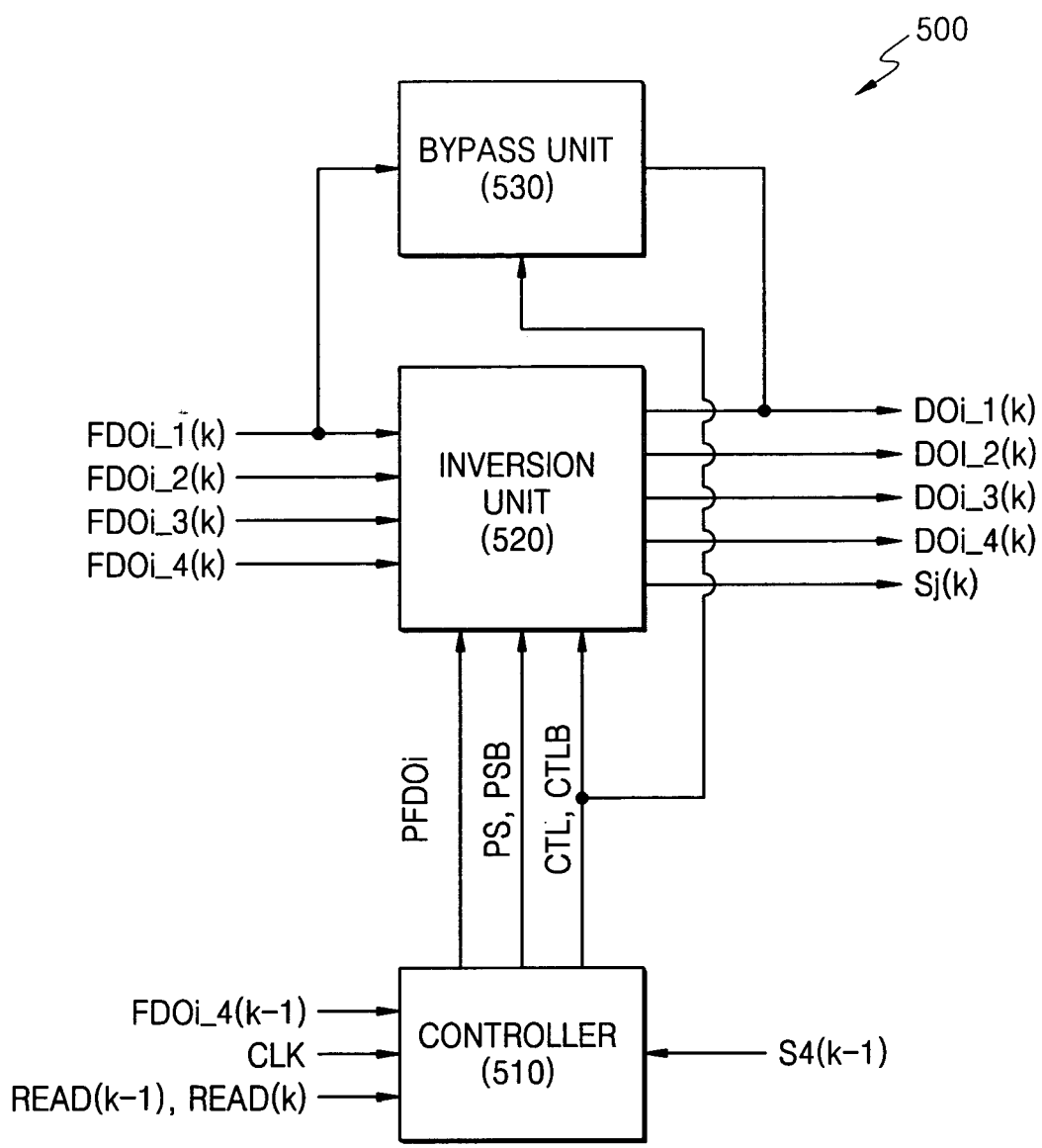
FIG. 15 is a block diagram illustrating a data inversion circuit according to further embodiments of the present invention as shown in FIG. 14.

FIG. 15 is a block diagram of a data inversion circuit according to further embodiments of the present invention as shown in FIG. 14. In FIG. 15, first through fourth input data FDOi_1(k−1) through FDOi_4(k−1) are read from the memory cell array 410 of FIG. 14 in response to a read command READ(k−1) (where k is a natural number greater than one), and first through fourth input data FDOi_1(k) through FDOi_4(k) are read from the memory cell array 410 in response to a read command READ(k). The read command READ(k−1) is prior to the read command READ(k), i.e. the read command READ(k−1) is an initial read command.

Referring now to FIG. 15, the data inversion circuit 500 includes a controller 510, an inversion unit 520 and a bypass unit 530. The configuration and operation of the data inversion circuit 500 may be similar to that of the data inversion circuit 200 shown in FIG. 3. However, the inversion unit 520 of the data inversion circuit 500 additionally receives first through fourth input data FDOi_1(k) through FDOi_4(k), which are simultaneously pre-fetched in response to the read command READ(k), and outputs first through fourth output data DOi_1(k) through DOi_4(k) (where k is a natural number equal to or greater than two). The controller 510 also receives a fourth input data FDOi_4(k−1) and a fourth flag signal S4(k−1) (where k is a natural number equal to or greater than two) along with first through fourth input data FDOi_1(k−1) through FDOi_4(k−1), which are simultaneously pre-fetched in response to the read command READ(k−1). Accordingly, the controller 510 outputs the fourth input data FDOi_4(k−1) as an initial input data PFDOi, and outputs the fourth flag signal S4(k−1) as an initial flag signal PS.

Figure 16:
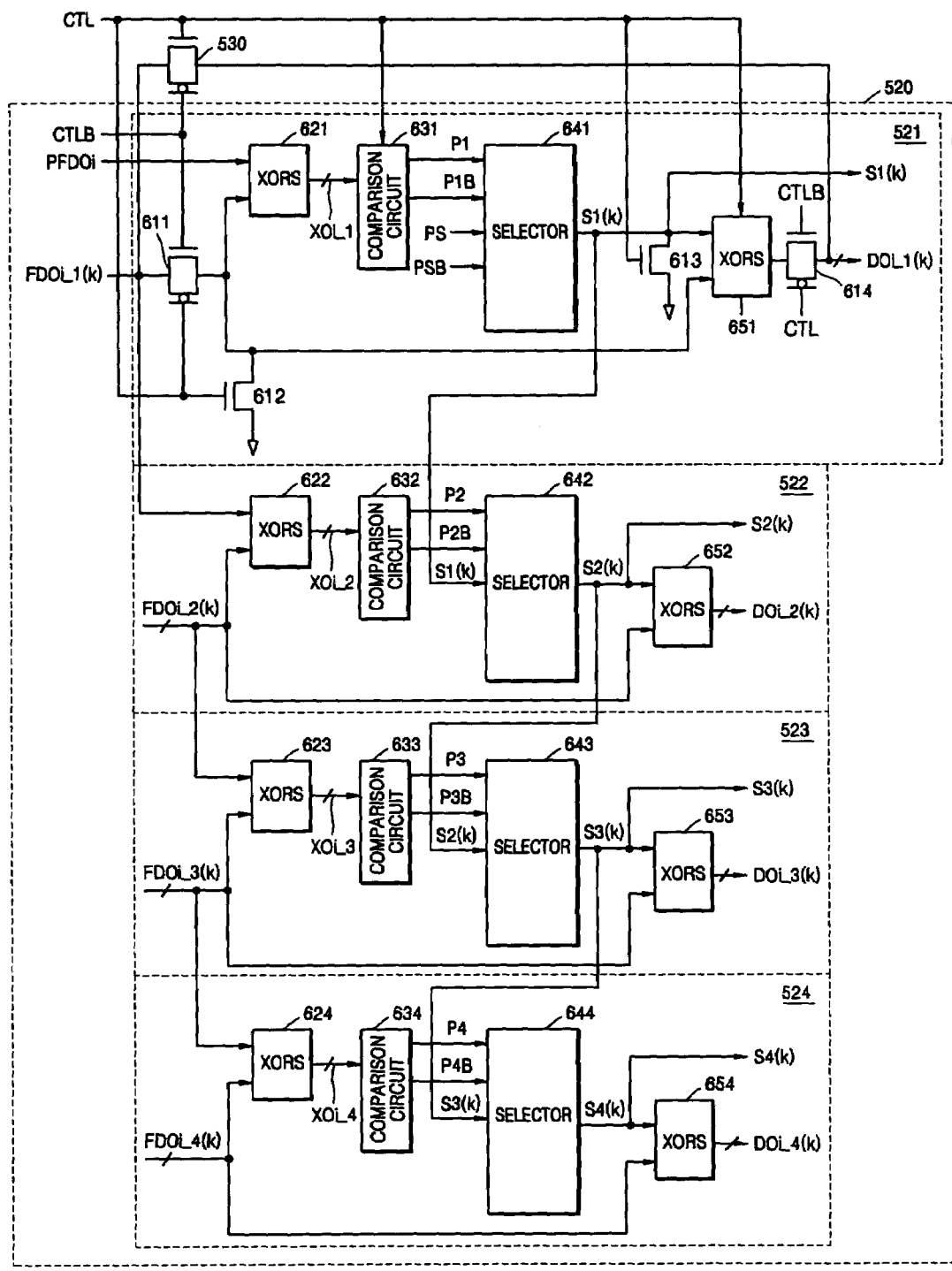
FIG. 16 is a block diagram illustrating an inversion unit and a bypass unit according to further embodiments of the present invention as shown in FIG. 15.

FIG. 16 is a block diagram of an inversion unit and a bypass unit according to further embodiments of the present invention as shown in FIG. 15. Referring to FIG. 16, the inversion unit 520 includes first through fourth inversion circuits 521 through 524. In FIG. 16, an inversion unit 520 including four inversion circuits based on a 4-bit pre-fetch scheme is illustrated. The number of inversion circuits included in the inversion unit 520 can be altered according to the type of a pre-fetch scheme. For example, if a 6-bit pre-fetch scheme is adopted, the inversion unit 520 may include six inversion circuits. The first through fourth inversion circuits 521 through 524 of FIG. 16 include first logic circuits 621 through 624, comparison circuits 631 through 634, selectors 641 through 644 and second logic circuits 651 through 654. The first inversion circuit 521 further includes switches 611 and 614 and NMOS transistors 612 and 613.

The configuration and operation of the first logic circuit 621 and the selector 641 are similar to that of the first logic circuit 222 and the selector 224 shown in FIG. 9. Also, the configuration and operation of the second logic circuit 651 are similar to that of the second logic circuit 225 described above with reference to FIGS. 9 and 11. Also, the configuration and operation of the comparison circuit 631 are similar to that of the comparison circuit 223 shown in FIG. 10. The operation of the first inversion circuit 521 (including first logic circuit 621, comparison circuit 631, selector 641, and second logic circuit 651) will be described below.

Still referring to FIG. 16, in the first inversion circuit 521, the switches 611 and 614 are turned on or off in response to a control signal CTL and an inverted control signal CTLB. The switches 611 and 614 may preferably be implemented by transmission gates. If the switch 611 is turned on, the switch 611 receives and outputs the first input data FDOi_1(k). Also, the first logic circuit 621 receives initial input data PFDOi of 8 bits from a controller 510 of FIG. 15 and receives the first input data FDOi_1(k) of 8 bits through the switch 611. The first logic circuit 621 determines whether each of the bits of the initial input data PFDOi are toggled with respect to corresponding bits of the first input data FDOi_1(k), and outputs the first internal logic signal XOi_1 (i=1 through 8) according to the determined result.

The comparison circuit 631 is enabled or disabled in response to the control signal CTL. When the comparison circuit 631 is enabled, the comparison circuit 631 outputs fist internal flag signals P1 and P1B in response to the first internal logic signal XOi_1. The selector 641 outputs one of the first internal flag signals P1 and P1B as a first flag signal S1(k) in response to the initial flag signal PS and the inverted initial flag signal PSB.

The second logic circuit 651 is enabled or disabled in response to the control signal CTL. When the second logic circuit 651 is enabled, the second logic circuit 651 receives the first input data FDOi_1(k) from the switch 611, and inverts and outputs the first input data FDOi_1(k) or outputs the first input data FDOi_1(k) without inversion as first output data DOi_1(k) in response to the first flag signal S1(k). When the switch 614 is turned on, the switch 614 receives the first output data DOi_1(k) from the second logic circuit 651 and outputs the first output data DOi_1(k).

The first input data FDOi_1(k) (where i=1–8) represents data to be first output through the first through eighth DQ pads, where the first through fourth input data FDOi_1(k) through FDOi_4(k) pre-fetched simultaneously according to the 4-bit pre-fetch scheme.

Still referring to FIG. 16, the drain of the NMOS transistor 612 is connected to an output terminal of the switch 611, the source of the NMOS transistor 612 is connected to the ground voltage, and the control signal CTL is applied to the gate of the NMOS transistor 612. The NMOS transistor 612 is turned on or off in response to the control signal CTL. If the NMOS transistor 612 is turned on, the NMOS transistor 612 pre-discharges the output terminal of the switch 611 to the ground voltage level.

Also, the drain of the NMOS transistor 613 is connected to an output terminal of the selector 641, the source of the NMOS transistor 613 is connected to the ground voltage, and the control signal CTL is applied to the gate of the NMOS transistor 613. The NMOS transistor 613 is turned on or off in response to the control signal CTL. If the NMOS transistor 613 is turned on, the NMOS transistor 613 pre-discharges the output terminal of the selector 641 to the ground voltage level. As a result, the first flag signal S1(k) is changed to a low (logic 0) level.

The bypass unit 530 may preferably be implemented by a transmission gate having input and output terminals which are respectively connected to input and output terminals of the first inversion circuit 521. The bypass unit 530 is turned on or off in response to the control signal CTL and the inverted control signal CTLB. If the bypass unit 530 is turned on, the bypass unit 530 receives the first input data FDOi_1(k) and outputs the first input data FDOi_1(k) as the first output data DOi_1(k). If the first inversion circuit 521 is enabled, the bypass unit 530 is disabled.

In the second inversion circuit 522, the first logic circuit 622 determines whether each of the bits of the first 8-bit input data FDOi_1(k) are toggled with respect to corresponding bits of the second 8-bit input data FDOi_2(k), and outputs a second internal logic signal XOi_2 according to the determined result. The comparison circuit 632 outputs second internal flag signals P2 and P2B in response to the second internal logic signal XOi_2. The selector 642 selects one of the second internal flag signals P2 and P2B in response to the first flag signal S1(k) and outputs the selected signal as a second flag signal S2(k). The second logic circuit 652 inverts and outputs the second input data FDOi_2(k) or outputs the second input data FDOi_2(k) without inversion as second output data DOi_2(k), in response to the second flag signal S2(k). The second input data FDOi_2(k) represents data to be output through the first through eighth DQ pads second, among the first through fourth input data FDOi_1(k) through FDOi_4(k) which are pre-fetched simultaneously.

In the third inversion circuit 523, the first logic circuit 623 determines whether each of the bits of the second 8-bit input data FDOi_2(k) are toggled with respect to corresponding bits of the third 8-bit input data FDOi_3(k), and outputs a third internal logic signal XOi_3 according to the determined result. The comparison circuit 633 outputs third internal flag signals P3 and P3B in response to the third internal logic signal XOi_3. The selector 643 selects one of the third internal flag signals P3 and P3B in response to the second flag signal S2(k) and outputs the selected signal as a third flag signal S3(k). The second logic circuit 653 inverts and outputs the third input data FDOi_3k or outputs the third input data FDOi_3k without inversion as third output data DOi_3(k), in response to the third flag signal S3(k). The third input data FDOi_3(k) represents data to be output through the first through eighth DQ pads third, among the first through fourth input data FDOi_1(k) through FDOi_4(k) which are pre-fetched simultaneously.

In the fourth inversion circuit 524, the first logic circuit 624 determines whether each of the bits of the third 8-bit input data FDOi_3(k) are toggled with respect to corresponding bits of the fourth 8-bit input data FDOi_4(k), and outputs a fourth internal logic signal XOi_4 according to the determined result. The comparison circuit 634 outputs fourth internal flag signals P4 and P4B in response to the fourth internal logic signal XOi_4. The selector 654 selects one of the fourth internal flag signals P4 and P4B in response to the third flag signal S3(k) and outputs the selected signal as a fourth flag signal S4(k). The second logic circuit 654 inverts and outputs the fourth input data FDOi_4(k) or outputs the fourth input data FDOi_4(k) without inversion as fourth output data DOi_4(k), in response to the fourth flag signal S4(k). The fourth input data FDOi_4(k) represents data to be output through the first through eighth DQ pads fourth, among the first through fourth input data FDOi_1(k) through FDOi_4(k) which are pre-fetched simultaneously.

The configurations and operations of first logic circuits 622 through 624 may be similar to that of the first logic circuit 222 shown in FIG. 9. Also, the configurations and operations of second logic circuits 652 through 654 may be similar to that of the second logic circuit 225 shown in FIG. 9, with the exception that second logic circuits 652 through 654 are not controlled by the control signal CTL.

Figure 17:
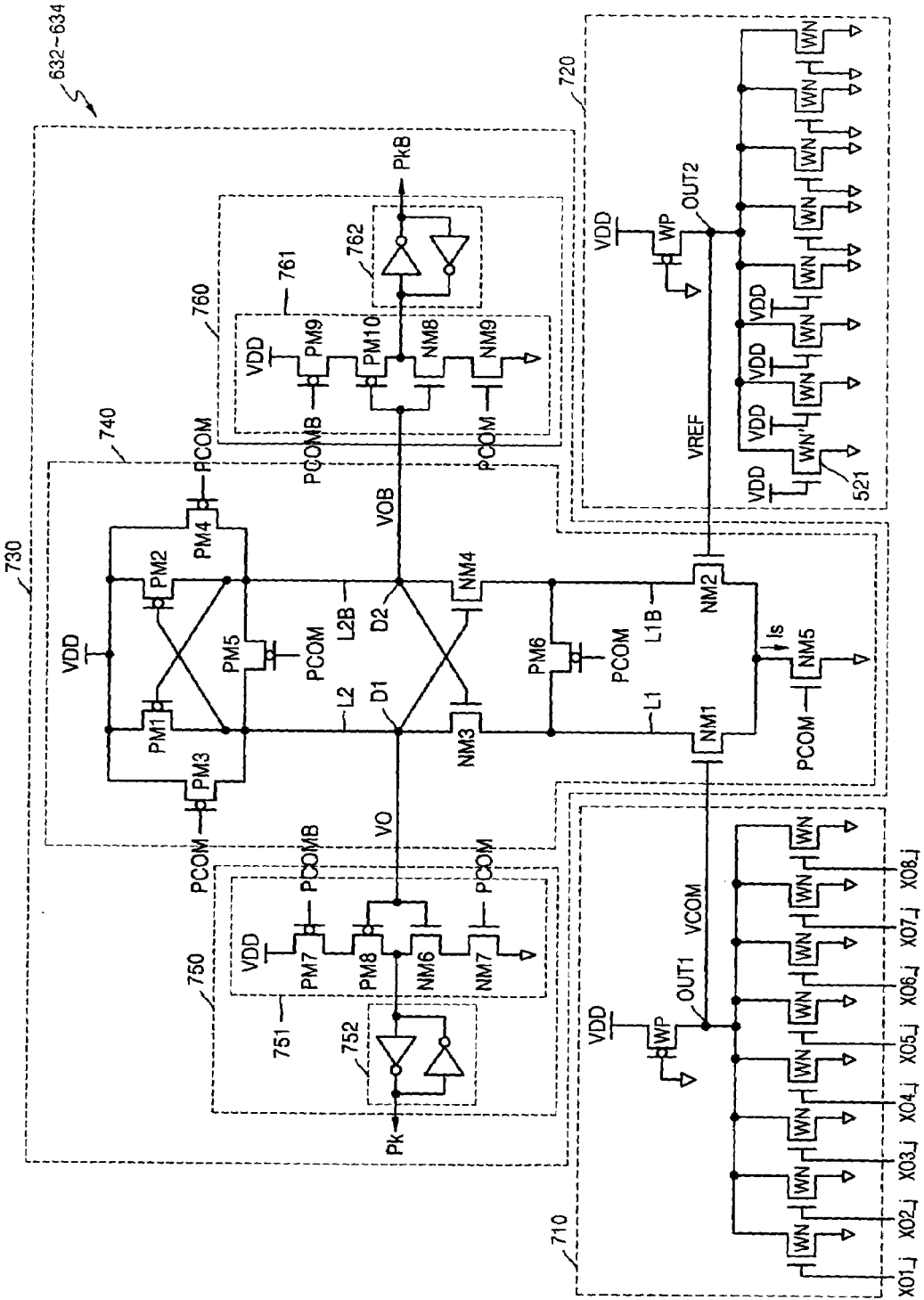
FIG. 17 is a schematic diagram illustrating comparison circuits according to further embodiments of the present invention as shown in FIG. 16.

FIG. 17 is a schematic diagram of comparison circuits according to further embodiments of the present invention as shown in FIG. 16. Referring to FIG. 17, each of the comparison circuits 632 through 634 includes a comparison voltage generator circuit 710, a reference voltage generator circuit 720 and an internal flag signal generator circuit 730.

The configurations and operations of the comparison voltage generator circuit 710 and the reference voltage generator circuit 720 may be similar to that of the comparison circuit 223 and the comparison voltage generator circuit 320 shown in FIG. 10, respectively, with the exception that the ground voltage is input to the gates of the PMOS transistors WP of the comparison voltage generator circuit 710 and the reference voltage generator circuit 720, while the control signal CTL is input to the gates of the PMOS transistors WP of the comparison voltage generator circuit 320 and the reference voltage generator circuit 330. Also, the configuration and operation of the internal flag signal generator circuit 730 may be similar to that of the internal flag signal generator circuit 340 of the comparison circuit 223, with the exception that the internal flag signal generator circuit 730 operates in response to the second internal control signal PCOM, while the internal flag signal generator circuit 340 operates in response to the control signal CTL. Accordingly, further description of the configuration and operation the comparison voltage generator circuit 710, the reference voltage generator circuit 720, and the internal flag signal generator 730 will not be provided.

Figure 18:
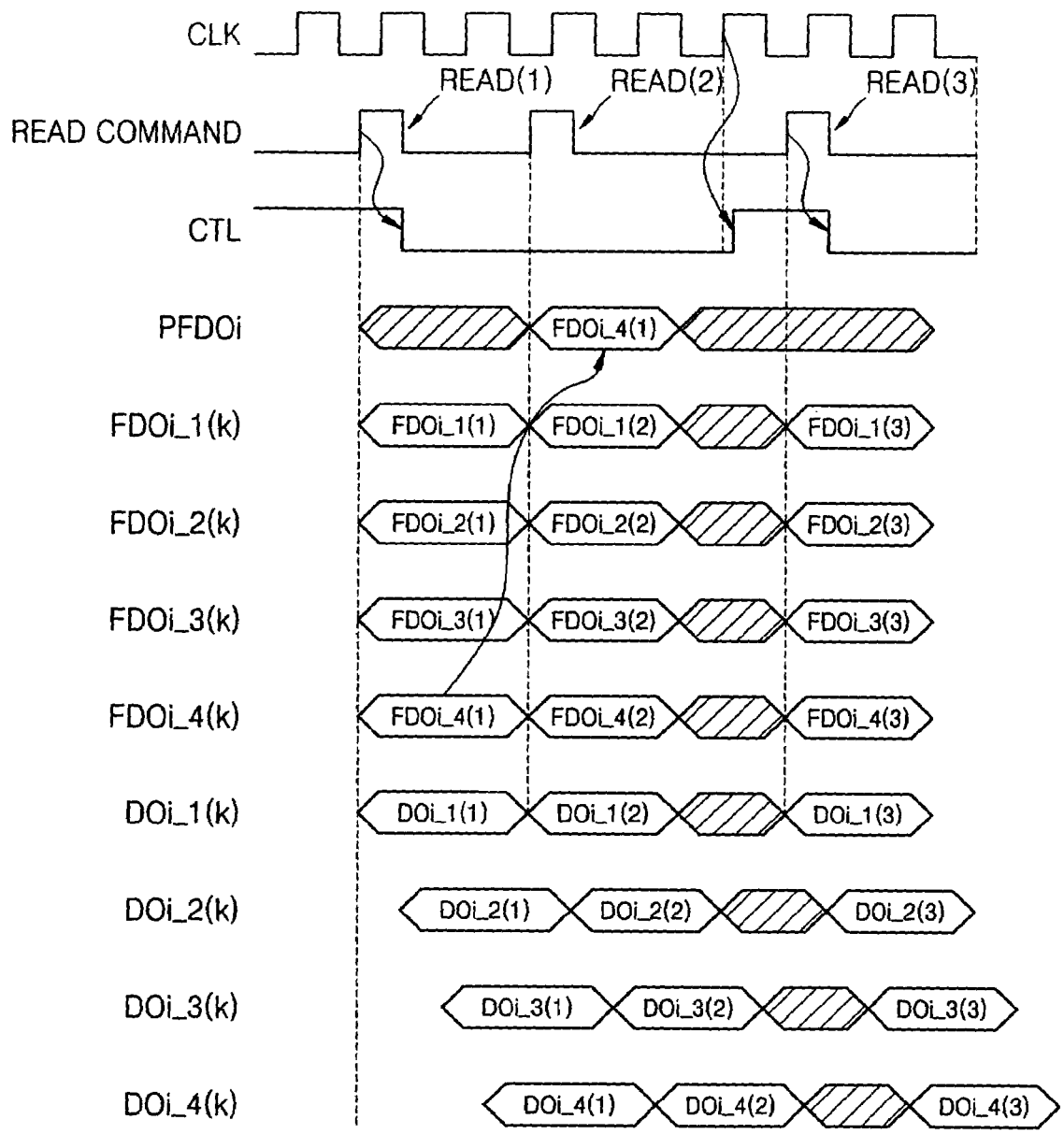
FIG. 18 is a timing diagram illustrating main input and output signals of a data inversion circuit according to further embodiments of the present invention as shown in FIG. 15.

Referring now to FIGS. 14 through 18, operations of the data inversion circuit 500 will be described. FIG. 18 is a timing diagram of main input and output signals used in a data inversion circuit according to further embodiments of the present invention as shown in FIG. 15. In FIG. 18, a timing diagram for the memory cell array 110, which outputs first through fourth input data FDOi_1(k) through FDOi_4 (k) (k=1 through 3) in response to sequential read commands READ(1) through READ(3), is illustrated. Exemplary values of the first through fourth input data FDOi_1(k) through FDOi_4(k) read in response to the read commands READ(1) through READ(4) are provided in Table. 4.

TABLE 4

| Read command | Input data | Bit value | | | | | | | |
|---|---|---|---|---|---|---|---|---|---|
| | | i=1 | i=2 | i=3 | i=4 | i=5 | i=6 | i=7 | i=8 |
| READ(1) | FDOi_1(1) | 1 | 1 | 1 | 1 | 0 | 0 | 0 | 0 |
| | FDOi_2(1) | 1 | 0 | 0 | 0 | 1 | 1 | 0 | 0 |
| | FDOi_3(1) | 1 | 1 | 0 | 0 | 1 | 1 | 0 | 0 |
| | FDOi_4(1) | 1 | 0 | 1 | 1 | 0 | 0 | 1 | 1 |
| READ(2) | FDOi_1(2) | 0 | 1 | 0 | 0 | 1 | 0 | 0 | 0 |
| | FDOi_2(2) | 0 | 0 | 0 | 0 | 1 | 1 | 1 | 0 |
| | FDOi_3(2) | 0 | 1 | 0 | 1 | 0 | 0 | 1 | 0 |
| | FDOi_4(2) | 1 | 0 | 0 | 1 | 1 | 1 | 0 | 0 |
| READ(3) | FDOi_1(3) | 1 | 1 | 1 | 1 | 1 | 1 | 1 | 0 |
| | FDOi_2(3) | 1 | 1 | 0 | 0 | 0 | 0 | 0 | 0 |
| | FDOi_3(3) | 1 | 1 | 1 | 1 | 1 | 0 | 0 | 0 |
| | FDOi_4(3) | 1 | 0 | 0 | 0 | 0 | 0 | 0 | 0 |

Referring to FIGS. 14 through 18, the memory cell array 410 pre-fetches the first through fourth input data FDOi_1 (1) through FDOi_4(1) simultaneously in response to the read command READ(1), and outputs the first through fourth input data FDOi_1(1) through FDOi_4(1) in parallel.

In an initial state, the control signal generator 540 of FIG. 4 of the controller 510 enables a control signal CTL to a high (logic 1) level. If the control signal CTL is at a high level, the bypass unit 530 is enabled and the first inversion circuit 521 of the inversion unit 520 is disabled. The bypass unit 530 outputs the first input data FDOi_1(1) "11110000" without inversion as first output data DOi_1(1). Accordingly, the first output data DOi_1(1) is "11110000". Also, the first inversion circuit 521 outputs a first flag signal S1(1) at a low (logic 0) level. More particularly, referring to FIG. 16, the NMOS transistor 613 of the first inversion circuit 521 is turned on in response to the control signal CTL, and pre-discharge an output terminal of the selector 641 to the ground voltage level. As a result, the first flag signal S1(1) is changed to a low level.

Also, each of the first logic circuits 622 through 624 of the second through fourth inversion circuits 522 through 524 receives the first through fourth input data FDOi_1(1) through FDOi_4(1) and outputs second through fourth internal logic signals XOi_2 through XOi_4. More particularly, the first logic circuit 622 performs an exclusive OR operation of the first input data FDOi_1(1) through FDO8_1(1) "11110000" and the second input data FDOi_2(1) through FDO8_2(1) "10001100". Since bits FDO2_1(1) through FDO6_1(1) of the first input data are toggled with respect to bits FDO2_2(1) through FDO6_2(1) of the second input data, the first logic circuit 622 outputs second internal logic signals XO1_2 through XO8_2 "01111100".

The first logic circuit 623 performs an exclusive OR operation of the second input data FDO1_2(1) through FDO8_2(1) "10001100" and the third input data FDO1_3(1) through FDO8_3(1) "11001100". Since bit FDO2_2(1) of the second input data is toggled with respect to bit FDO2_3 (1) of the third input data, the first logic circuit 623 outputs third internal logic signals XO1_3 through XO8_3 "01000000".

Likewise, the first logic circuit 624 performs an exclusive OR operation of the third input data FDOi_3(1) through FDO8_3(1) "11001100" and the fourth input data FDO1_4 (1) through FDO8_4(1) "10110011". Since bits FDO2_3(1) through FDO8_3(1) of the third input data are toggled with respect to bits FDO2_4(1) through FDO8_4(1) of the fourth input data, the first logic circuit 624 outputs fourth internal logic signals XO1_4 through XO8_4 "01111111". The first logic circuits 622 through 624 operate at the same time.

Thereafter, the comparison circuit 632 outputs second internal flag signals P2 and P2B in response to the second internal logic signals XO1_2 through XO8_2. The comparison circuit 632 outputs a second internal flag signal P2 at a high level and a second internal flag signal P2B at a low level since half or more of the second internal logic signals XO1_2 through XO8_2 "01111100" are at a high level.

The comparison circuit 633 outputs third internal flag signals P3 and P3B in response to the third internal logic signals XO1_3 through XO8_3. The comparison circuit 633 outputs a third internal flag signal P3 at a low level and a third flag signal P3B at a high level since only one bit of the third internal logic signals XO1_3 through XO8_3 "01000000" is at a high level.

Also, the comparison circuit 634 outputs fourth internal flag signals P4 and P4B in response to the fourth internal logic signals XO1_4 through XO8_4. The comparison circuit 634 outputs a fourth internal flag signal P4 at a high level and a fourth internal flag signal P4B at a low level since half or more of the fourth internal logic signals XO1_4 through XO8_4 "01111111" are at a high level. The comparison circuits 632 through 634 also operate at the same time.

Thereafter, the selector 642 outputs a second internal flag signal P2 at a high level as a second flag signal S2(1), since the first flag signal S1(1) is at a low level. Also, the selector 643 outputs a third flag signal P3B at a high level as a third flag signal S3(1), since the second flag signal S2(1) is at a high level. The selector 644 outputs a fourth internal flag signal P4B at a low level as a fourth flag signal S4(1), since the third flag signal S3(1) is at a high level.

Then, the second logic circuit 652 inverts the second input data FDO1_2(1) through FDO8_2(1) "10001100" and outputs second output data DO1_2(1) through DO8_2(1) "01110011" since the second flag signal S2(1) is at a high level.

The second logic circuit 653 inverts the third input data FDO1_3(1) through FDO8_3(1) "11001100" and outputs third output data DO1_3(1) through DO8_3(1) "00110011" since the third flag signal S3(1) is at a high level.

The second logic circuit 654 outputs the fourth input data FDO1_4(1) through FDO8_4(1) "10110011" as fourth output data DO1_4(1) through DO8_4(1) since the fourth flag signal S4(1) is at a low level.

The control signal generator 540 disables the control signal CTL to a low level when the read command READ(1) is received. Also, the initial input data generator 540 of FIG. 4 of the controller 510 latches and stores the fourth input data FDOi_4(1) "10110011" in response to the control signal CTL and the read command READ(1). In addition, when the read command READ(1) is received, the initial flag signal generator 560 of FIG. 4 of the controller 210 latches and stores the fourth flag signal S4(1) at a low level in response to the control signal CTL and the read command READ(1).

Thereafter, when the following read command READ(2) is received, the memory cell array 410 pre-fetches the first through fourth input data FDOi_1(2) through FDOi_4(2) at the same time, and outputs the first through fourth input data FDOi_1(2) through FDOi_4(2) in parallel. The control signal generator 540 determines whether or not the read interval between receipt of the read command READ(1) and the read command READ(2) exceeds a predetermined number of clock cycles. In this case, the predetermined number of clock cycles is two. In FIG. 18, since the read command READ(2) is received within two clock cycles from receipt of the read command READ(1), the control signal generator 540 maintains the control signal CTL at a low level. Also, the initial input data generator 550 outputs the stored fourth input data FDOi_4(1) as initial input data PFDOi when the read command READ(2) is received. The initial flag signal generator 560 also outputs the stored fourth flag signal S4(1) as an initial flag signal PS, and further outputs an inverted initial flag signal PSB when the read command READ(2) is received.

Since the control signal CTL is at a low level, the first inversion circuit 521 is enabled and the bypass unit 530 is disabled. The first logic circuit 621 receives the first 8-bit input data FDOi_1(2) "01001000" through the switch 611 and receives the initial 8-bit input data PFDOi "10110011" from the initial input data generator 550. The first logic circuit 621 performs an exclusive OR operation of the first input data FDOi_1(2) "01001000" and the initial input data PFDOi "10110011". Since the bits of the first input data are toggled with respect to the corresponding bits of the initial input data, except for bit FDO6_1(2) of the first input data and a bit PFDO6 of the initial input data, the first logic circuit 621 outputs first internal logic signals XO1_1 through XO8_1 "11111011".

The first logic circuits 622 through 624 may operate similarly to those described above. The first logic circuit 622 receives the first input data FDOi_1(2) "01001000" and the second input data FDOi_2(2) "00001110" and outputs the second internal logic signals XO1_2 through XO8_2 "01000110". The first logic circuit 623 receives the second input data FDOi_2(2) "00001110" and the third input data FDOi_3(2) "01010010" and outputs third internal logic signals XO1_3 through XO8_3 "01011100". The first logic circuit 624 receives the third input data FDOi_3(2) "01010010" and the fourth input data FDOi_4(2) "10011100" and outputs fourth internal logic signals XO1_4 through XO8_4 "11001110".

Thereafter, the comparison circuit 631 outputs a first internal flag signal P1 at a high level and a first internal flag signal P1B at a low level since half or more of the first internal logic signals XO1_1 through XO8_1 "11111011" are at a high level. The comparison circuit 632 outputs a second internal flag signal P2 at a low level and a second internal flag signal P2B at a high level since three bits of the second internal logic signals XO1_2 through XO8_2 "01000110" are at a high level. The comparison circuit 633 outputs a third internal flag signal P3 at a high level and a third internal flag signal P3B at a low level since four bits of the third internal logic signals XO1_3 through XO8_3 "01011100" are at a high level. Also, the comparison circuit 634 outputs a fourth internal flag signal P4 at a high level and a fourth internal flag signal P4B at a low level since half or more of the fourth internal logic signals XO1_4 through XO8_4 "11001110" are at a high level.

Thereafter, the selector 641 outputs a first internal flag signal P1 at a high level as a first flag signal S1(2) since the initial flag signal PS is at a low level. The selector 642 outputs a second internal flag signal P2B at a high level as a second flag signal S2(2) since the first flag signal S1(2) is at a high level. Also, the selector 643 outputs a third flag signal P3B at a low level as a third flag signal S3(2) since the second flag signal S2(2) is at a high level. The selector 644 outputs a fourth internal flag signal P4 at a high level as a fourth flag signal S4(2) since the third flag signal S3(2) is at a low level.

Then, the second logic circuit 651 inverts the first input data FDOi_1(2), "01001000" and outputs first output data DO1_1(2) through DO8_1(2) "10110111" since the first flag signal S1(2) is at a high level. The second logic circuit 652 inverts the second input data FDO1_2(2) through FDO8_2(2) "00001110" and outputs second output data DO1_2(2) through DO8_2(2) "11110001" since the second flag signal S2(2) is at a high level. The second logic circuit 653 outputs the third input data FDO1_3(2) through FDO8_3(2) "01010010" as third output data DO_3(2) through DO8_3(2) without inversion, since the third flag signal S3(2) is at a low level. The second logic circuit 654 inverts the fourth input data FDO1_4(2) through FDO8_4(2) "10011100" and outputs fourth output data DO1_4(4) through DO8_4(4) "01100011" since the fourth flag signal S4(2) is at a high level.

When the read command read READ(2) is received, the initial input data generator 540 latches and stores the fourth input data FDOi_4(2) "10011100" in response to the control signal CTL and the read command READ(2). Also, when the read command READ(2) is received, the initial flag signal generator 560 latches and stores the fourth flag signal S4(2) at the high level in response to the control signal CTL and the read command READ(2).

Thereafter, if the read command READ(3) is received, the memory cell array 410 pre-fetches the first through fourth input data FDOi_1(3) through FDOi_4(3) at the same time and outputs the first through fourth input data FDOi_1(3) through FDOi_4(3) in parallel. Also, the control signal generator 540 determines whether the read interval between receipt of the read command READ(2) and the read command READ(3) exceeds two clock cycles. In FIG. 18, the read command READ(3) is received more than two clock cycles after the read command READ(2) is received. Accordingly, the control signal generator 540 enables the control signal CTL in response to the rising edge of the third clock signal CLK from when the read command READ(2) is enabled. In other words, the control signal CTL is enabled if the time interval between receipt of READ(2) and READ(3) is greater than two clock cycles. The control signal generator 540 disables the control signal CTL in response to receipt of the read command READ(3).

When the control signal CTL is enabled, the bypass unit 530 is enabled and outputs the first input data FDOi_1(3) "11111110" as first output data DOi_1(3) without inversion. Accordingly, the first output data DOi_1(3) is "11111110". At this time, the first inversion circuit 521 is disabled, and first flag signal S1(3) is output at a low level. The second through fourth inversion circuits 522 through 524 may operate similarly to that of the first inversion circuit 521.

When the read command READ(3) is not received within the predetermined period, a data output unit 552 of the initial input data generator 550 is disabled and does not output the initial input data PFDi. Also, a flag output unit 662 of the initial flag signal generator 660 is disabled and does not output the initial flag signal PS and the inverted initial flag signal PSB.

When the read command READ(3) is received, the data latch unit 551 of the initial input data generator 550 latches and stores the fourth input data FDOi_4(3) in response to the control signal CTL and the read command READ(3). Also, a flag latch unit 561 of the initial flag signal generator 560 latches and stores the fourth flag signal S4(3) in response to the control signal CTL and the read command READ(3).

Exemplary values for the first through fourth output data DOi_1(k) to DOi_4(k) and the first through fourth flag signals S1(k) to S4(k) (corresponding to the first through fourth input data FDOi_1(k) through FDOi_4(k)) which are output from the data inversion circuit 500 are shown in Table 5.

TABLE 5

| Output data | Bit value | | | | | | | | Flag signal | Bit value |
|---|---|---|---|---|---|---|---|---|---|---|
| | i = 1 | i = 2 | i = 3 | i = 4 | i = 5 | i = 6 | i = 7 | i = 8 | | |
| DOi_1(1) | 1 | 1 | 1 | 1 | 0 | 0 | 0 | 0 | S1(1) | 0 |
| DOi_2(1) | 0 | 1 | 1 | 1 | 0 | 0 | 1 | 1 | S2(1) | 1 |
| DOi_3(1) | 0 | 0 | 1 | 1 | 0 | 0 | 1 | 1 | S3(1) | 1 |
| DOi_4(1) | 1 | 0 | 1 | 1 | 0 | 0 | 1 | 1 | S4(1) | 0 |
| DOi_1(2) | 1 | 0 | 1 | 1 | 0 | 1 | 1 | 1 | S1(2) | 1 |
| DOi_2(2) | 1 | 1 | 1 | 1 | 0 | 0 | 0 | 1 | S2(2) | 1 |
| DOi_3(2) | 0 | 1 | 0 | 1 | 0 | 0 | 1 | 0 | S3(2) | 0 |
| DOi_4(2) | 0 | 1 | 1 | 0 | 0 | 0 | 1 | 1 | S4(2) | 1 |
| DOi_1(3) | 1 | 1 | 1 | 1 | 1 | 1 | 1 | 0 | S1(3) | 0 |
| DOi_2(3) | 0 | 0 | 1 | 1 | 1 | 1 | 1 | 1 | S2(3) | 1 |
| DOi_3(3) | 0 | 0 | 0 | 0 | 0 | 1 | 1 | 1 | S3(3) | 1 |
| DOi_4(3) | 1 | 0 | 0 | 0 | 0 | 0 | 0 | 0 | S4(3) | 0 |

As described above, a data inversion circuit 500 according to further embodiments of the present invention may bypass and output first input data as output data as the data output circuit (not shown) of the semiconductor memory device 400 may be in a stable state when the read interval exceeds a predetermined number of clock cycles. On the other hand, if the read interval is less than or equal to the predetermined number of clock cycles, the data inversion circuit 500 can compare the first input data with the fourth input data pre-fetched in response to a previous read command, and decide whether or not to invert the first input data based on the result of the comparison. In other words, the data inversion circuit 500 may disable an inversion operation when a data non-read interval (shown by an oblique lined portion in FIG. 18) is greater than a predetermined period, such that input data may be processed at a higher speed.

Figure 19:
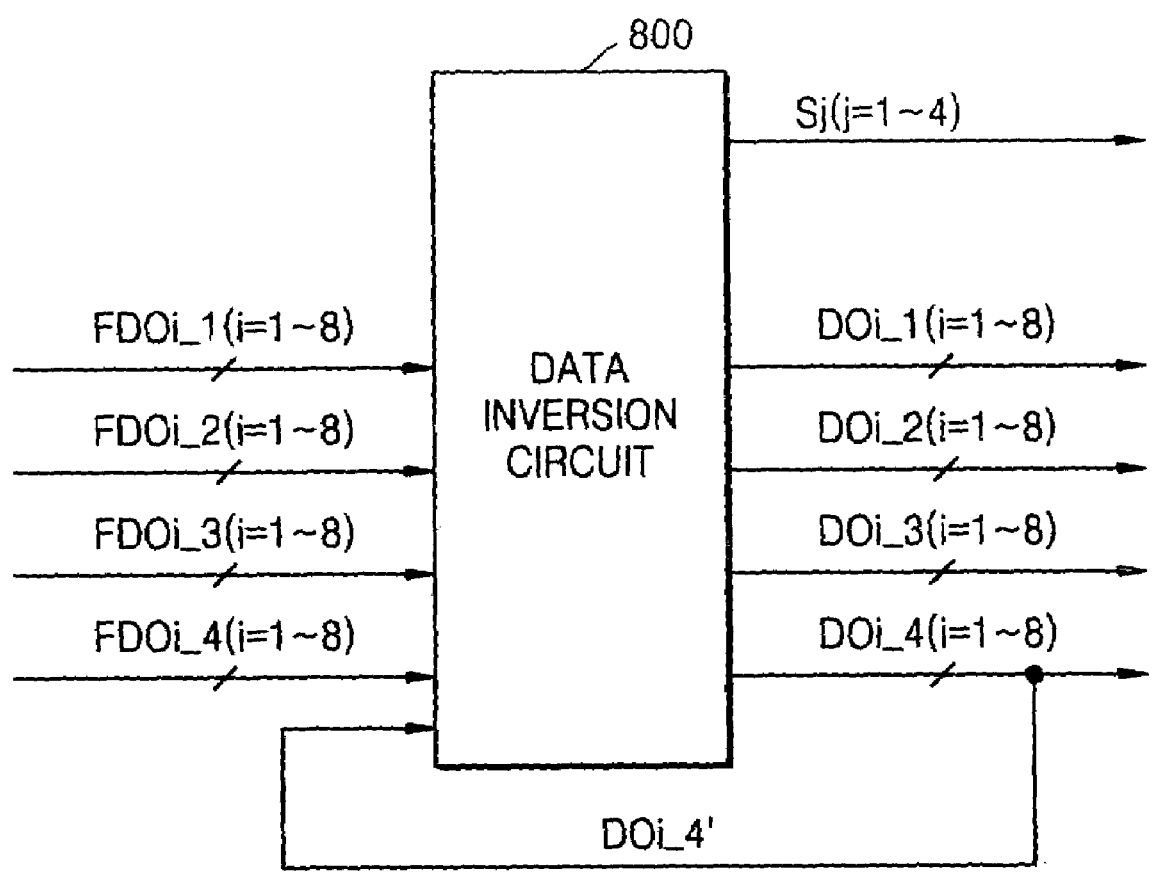
FIG. 19 is a block diagram illustrating a conventional data inversion circuit.
Figure 20:
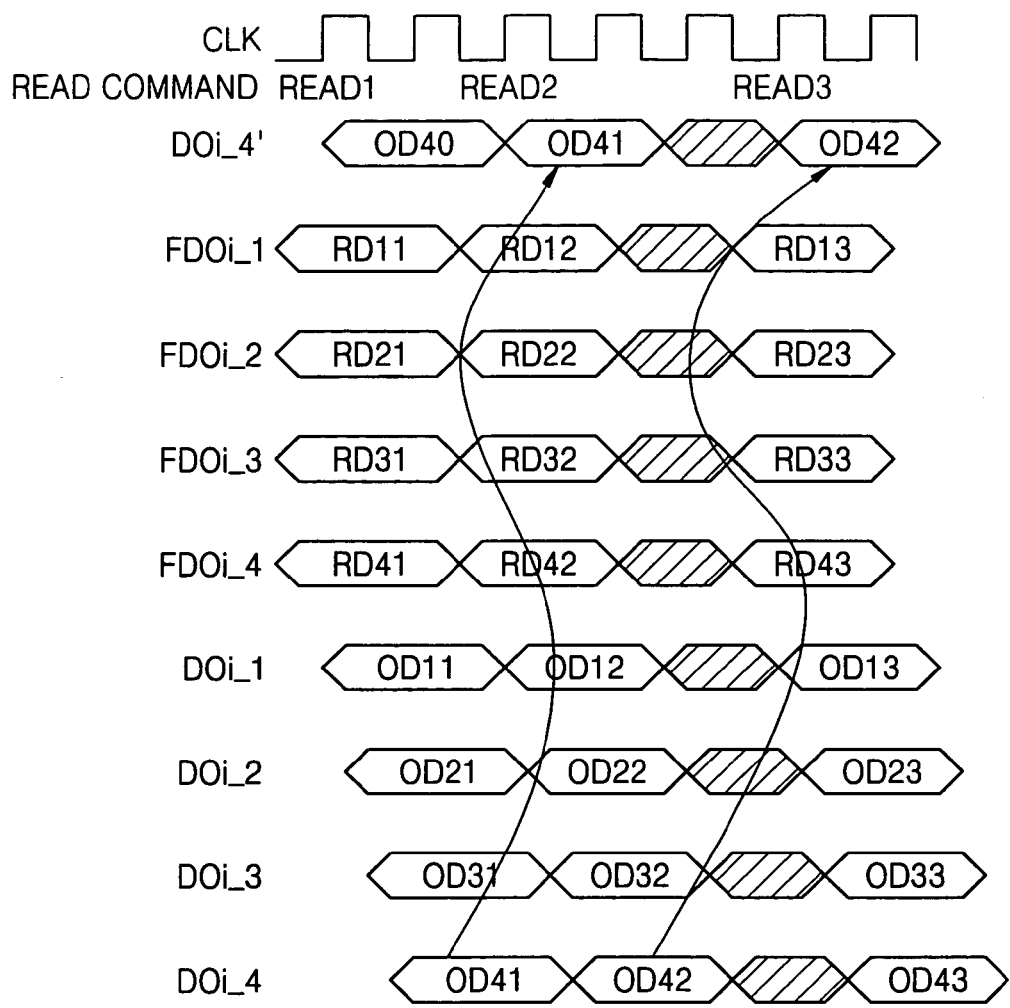
FIG. 20 is a timing diagram illustrating main input and output signals of a conventional data inversion circuit as shown in FIG. 19.

FIG. 19 illustrates a conventional data inversion circuit, and FIG. 20 illustrates a timing diagram of main input and output signals used in a data inversion circuit as shown in FIG. 19. Referring now to FIG. 19, the data inversion circuit 800 receives the first through fourth input data FDOi_1 through FDOi_4 (i=1 through 8) which are simultaneously pre-fetched in response to a data read command, and receives fourth output data DOi_4' which was output in a previous clock cycle. The data inversion circuit 800 determines whether or not to invert the first through fourth input data FDOi_1 through FDOi_4, and inverts and outputs the first through fourth input data FDOi_1 through FDOi_4 or output the first through fourth input data FDOi_1 through FDOi_4 as first through fourth output data DOi_1 through DOi_4 (i=1 through 8) without inversion, according to the determined result. Further, the data inversion circuit 800 outputs a flag signal Sj (j=1 through 4) indicating inversion/non-inversion of the first through fourth input data FDOi_1 through FDOi_4. The configuration and operation of the data inversion circuit of FIG. 19 are further described in commonly assigned U.S. Pat. No. 6,788,106, filed Mar. 26, 2003, the disclosure of which is hereby incorporated by reference herein.

As described above with reference to FIG. 19, in order to decide inversion/non-inversion of the first input data FDOi_1 to be currently output, the first input data FDOi_1 is compared with the fourth output data DOi_4' which was output in the previous clock cycle. Accordingly, the data inversion circuit may wait until the fourth output data DOi_4' is output in order to decide inversion/non-inversion of the first input data FDOi_1. As such, the operational speed of the data inversion circuit 800 may be reduced.

Also, a data non-read interval can exist before the first input data FDOi_1 to be currently output is read. However, in FIG. 19, the data inversion circuit performs inversion/non-inversion of the first input data FDOi_1 even if the data output circuit (not shown) of the semiconductor memory device is stabilized during the data non-read interval. Thus, the operational speed of the data inversion circuit may be reduced.

As described above, a data inversion circuit and data inversion method according to some embodiments of the present invention can process data at higher speeds and can reduce current consumption (caused by unnecessary inversion operations) by performing an inversion operation on the data or by bypassing data based on a data read interval. Some embodiments of the invention as described above include a 4-bit pre-fetch scheme; however, the number of bits to be pre-fetched may be altered. Also, in some embodiments of the invention as described above, the decision of whether or not to perform an inversion operation may be determined based on 8-bit input data; however, the number of bits of the input data also can be changed.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a data inversion circuit configured to support an inversion mode of operation that inverts selected ones of a plurality of N-bit words received in consecutive sequence at inputs thereof, and further configured to support a bypass mode of operation that disables inversion of a second one of the plurality of N-bit words in response to detecting that a delay between receipt of the second one of the plurality of N-bit words and receipt of an immediately preceding first one of the plurality of N-bit words is greater than a predetermined time interval.

2. The device of claim 1, wherein the data inversion circuit comprises an inversion unit configured to support the inversion mode of operation and a bypass unit configured to support the bypass mode of operation, wherein the bypass mode of operation is selectively enabled in response to a control signal indicating that the delay is greater than the time interval.

3. The device of claim 2, wherein the control signal indicates when a delay window between receiving two consecutive read instructions is greater than a predetermined number of clock cycles.

4. The device of claim 2, wherein the bypass unit is selectively enabled when the control signal has a first logic value, and wherein the bypass unit is disabled when the control signal has a second logic value opposite the first logic value.

5. The device of claim 4, wherein the inversion unit is disabled when the control signal has the first logic value, and wherein the inversion unit is enabled when the control signal has the second logic value.

6. The device of claim 2, further comprising a controller that evaluates the delay and generates the control signal when the delay is greater than a predetermined number of clock cycles.

7. The device of claim 6, wherein the delay is a read interval between receiving a first read instruction for the first word and a second read instruction for the second word, and wherein the controller further comprises a control signal generator that generates the control signal at a logic 1 value when the read interval is greater than the predetermined number of clock cycles.

8. The device of claim 7, wherein the control signal generator comprises:
a latch unit configured to generate the control signal at a logic 1 value responsive to a clock signal indicating passage of a predetermined number of clock cycles from receipt of the first read instruction; and
a reset unit configured to reset the control signal to a logic 0 value responsive to receipt of the second read instruction.

9. The device of claim 1, wherein the plurality of N-bit words comprises groups of N-bit words received in consecutive sequence in response to corresponding consecutive read instructions, and wherein the bypass mode of operation disables inversion of a first one of a second group of N-bit words when a delay between receipt of the first one of the second group of N-bit words and receipt of a last one of an immediately preceding first group of N-bit words is greater than a predetermined number of clock cycles.

10. The device of claim 9, wherein the device is a dual data rate (DDR) memory device, and further comprising a memory cell array that is configured to support a 4-bit prefetch operation in response to the consecutive read instructions, wherein each group comprises four N-bit words.

11. An integrated circuit device, comprising:
a data inversion circuit in a read path of the integrated circuit device, the data inversion circuit comprising an inversion unit configured to inhibit simultaneous switching noise by inverting selected ones of a plurality of N-bit words received in consecutive sequence at inputs thereof, and further comprising a bypass unit configured to remove the inversion unit from the read path of the integrated circuit device in response to a control signal indicating that a delay between receipt of two consecutive N-bit words in the read path exceeds a predetermined time interval.

12. The device of claim 11, further comprising a controller that evaluates the delay and generates the control signal when the delay is greater than a predetermined number of clock cycles.

13. The device of claim 12, wherein the delay is a read interval between receiving a first read instruction for a first word and a second read instruction for a second word, and wherein the controller further comprises a control signal generator that generates the control signal at a logic 1 value when the read interval is greater than the predetermined number of clock cycles.

14. The device of claim 13, wherein the control signal generator comprises:
a latch unit configured to generate the control signal at a logic 1 value responsive to a clock signal indicating passage of a predetermined number of clock cycles from receipt of the first read instruction; and
a reset unit configured to reset the control signal to a logic 0 value responsive to receipt of the second read instruction.

15. The device of claim 11, wherein the plurality of N-bit words comprises groups of N-bit words received in consecutive sequence in response to corresponding consecutive read instructions, and wherein the bypass mode of operation disables inversion of a first one of a second group of N-bit words when a delay between receipt of the first one of the second group of N-bit words and receipt of a last one of an immediately preceding first group of N-bit words is greater than a predetermined number of clock cycles.

16. A method of operating a memory device read path having a data inversion circuit therein that is configured to reduce simultaneous switching noise when enabled, comprising:
  reading data through an inversion unit of the data inversion circuit to thereby reduce simultaneous switching noise at outputs of the memory device during first read operations; and
  bypassing the inversion unit to thereby reduce a read latency of the read path during second read operations that are less susceptible to simultaneous switching noise relative to the first read operations.

17. A data inversion circuit of a semiconductor device comprising:
  a controller which receives read commands enabled sequentially per a predetermined read interval and a clock signal, wherein the controller outputs a control signal according to the read interval and generates initial input data and an initial flag signal in response to the control signal and the read commands;
  a bypass unit which is enabled or disabled in response to the control signal, wherein the bypass unit outputs input data read from a memory cell array as output data in response to the read commands when the bypass unit is enabled; and
  an inversion unit which is enabled or disabled in response to the control signal, wherein the inversion unit performs inversion/non-inversion of the input data in response to the input data, the initial input data and the initial flag signal when the inversion unit is enabled, and wherein the inversion unit generates the inverted/non-inverted data as the output data,
  wherein the inversion unit is disabled when the bypass unit is enabled and the read interval is changed by a frequency in which the read command is generated.

18. The data inversion circuit of claim 17, wherein the read commands include a first read command enabled during a first predetermined time and a second read command enabled after the first predetermined time, wherein the first read command is prior to the second read command, and wherein the input data includes first input data read from the memory cell array in response to the first read command, and second input data read from the memory cell array in response to the second read command.

19. The data inversion circuit of claim 18, wherein the controller comprises:
  a control signal generator, which receives the first and second read commands and the clock signal, determines whether the read interval exceeds a second predetermined time, and generates the control signal according to the determined result;
  an initial input data generator, which stores the first input data in response to the control signal and the first read command, and outputs the stored first input data as the initial input data in response to the second read command; and
  an initial flag signal generator, which stores a first flag signal indicating inversion/non-inversion of the first input data in response to the control signal and the first read command, and outputs the stored first flag signal as the initial flag signal in response to the control signal and the second read command.

20. The data inversion circuit of claim 19, wherein the controller further comprises:
  a first inverter, which inverts the control signal and outputs an inverted control signal; and
  a second inverter, which inverts the initial flag signal and outputs an inverted initial flag signal.

21. The data inversion circuit of claim 19, wherein the control signal generator comprises:
  a latch unit, which receives a first internal control signal in response to the clock signal, delays the first internal control signal during a third predetermined time, and outputs the delayed first internal control signal as the control signal; and
  a reset unit, which resets the latch unit in response to each of the read commands.

22. The data inversion circuit of claim 21, wherein the latch unit comprises:
  a first inverter, which inverts the clock signal and outputs an inverted clock signal;
  first switches, which are turned on or off in response to the clock signal and the inverted clock signal;
  second switches, whose input terminals are connected respectively to output terminals of the first switches, which are turned on or off in response to the clock signal and the inverted clock signal, and are turned off when the first switches are turned on;
  first latch circuits, which are connected respectively between output terminals of the first switches and input terminals of the second switches and latch and output first output signals of the first switches to the second switches; and
  second latch circuits, whose input terminals are connected respectively to output terminals of the second switches and which latch and output second output signals of the second switches,
  wherein at least a switch of the first switches receives the first internal control signal and outputs the first internal control signal as the first output signal when the switch is turned on, and at least a latch circuit of the second latch circuits outputs a second output signal received from the second switch as the control signal, an input terminal of the latch circuit being connected to an output terminal of the second switch.

23. The data inversion circuit of claim 22, wherein the reset unit comprises:
  a second inverter, which inverts the read commands respectively and outputs inverted read commands;
  first pre-discharge circuits, which are enabled or disabled in response to the read commands and pre-discharge input terminals of the first latch circuits to a ground voltage level when the first pre-discharge circuits are enabled; and
  second pre-discharge circuits, which are enabled or disabled in response to the inverted read commands, and pre-charge input terminals of the second latch circuits to an internal voltage level when the second pre-discharge circuits are enabled.

24. The data inversion circuit of claim 19, wherein the initial input data generator comprises:
  a data storage unit, which is enabled or disabled in response to the control signal and the first read command and latches and stores the first input data when the data storage unit is enabled; and
  a data output unit, which is enabled or disabled in response to the second read command and outputs first input data received from the data storage unit as the initial input data when the data output unit is enabled.

25. The date inversion circuit of claim 19, wherein the initial flag signal generator comprises:
- a flag storage unit, which is enabled or disabled in response to the control signal and the first read command and latches and stores the first flag signal when the flag storage unit is enabled; and
- a flag output unit, which is enabled or disabled in response to the second read command, and outputs the initial flag signal in response to the control signal and a first flag signal received from the flag storage unit when the flag output unit is enabled.

26. The data inversion circuit of claim 25, wherein the flag output unit maintains the initial flag signal in a low level when the control signal is in a high level, and outputs the first flag signal as the initial flag signal when the control signal is in a low level.

27. A data inversion method used in a semiconductor device, the method comprising:
- (a) receiving read commands enabled sequentially per a predetermined read interval and a clock signal;
- (b) determining whether the read interval exceeds a predetermined time interval and generating a control signal according to the determined result;
- (c) generating initial input data and an initial flag signal in response to the control signal and the read commands;
- (d) bypassing input data read from a memory cell array in response to the read commands when the control signal is enabled and outputting the input data as output data; and
- (e) performing inversion/non-inversion of the input data in response to the input data, the initial input data, and the initial flag signal, and generating the inverted/non-inverted data as output data when the control signal is disabled, wherein the read interval is changed by a frequency in which the read commands are generated.

* * * * *